US011740966B2

(12) United States Patent
Kang et al.

(10) Patent No.: US 11,740,966 B2
(45) Date of Patent: *Aug. 29, 2023

(54) MEMORY DEVICE AND OPERATING METHOD OF THE MEMORY DEVICE AND HOST DEVICE

(71) Applicant: SAMSUNG ELECTRONICS CO., LTD., Suwon-si (KR)

(72) Inventors: Young San Kang, Yongin-si (KR); Walter Jun, Seoul (KR); Ye Jin Cho, Hwaseong-si (KR); Sung Tack Hong, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

This patent is subject to a terminal disclaimer.

(21) Appl. No.: 17/539,898

(22) Filed: Dec. 1, 2021

(65) Prior Publication Data

US 2022/0334921 A1  Oct. 20, 2022

(30) Foreign Application Priority Data

Apr. 19, 2021 (KR) .................. 10-2021-0050328

(51) Int. Cl.
| | |
|---|---|
| *G06F 11/10* | (2006.01) |
| *G06F 13/28* | (2006.01) |
| *G06F 11/30* | (2006.01) |
| *G06F 11/16* | (2006.01) |
| *G06F 11/07* | (2006.01) |
| *G06F 13/16* | (2006.01) |
| *H03M 13/11* | (2006.01) |

(52) U.S. Cl.
CPC ........ *G06F 11/1068* (2013.01); *G06F 11/076* (2013.01); *G06F 11/0772* (2013.01); *G06F 13/1668* (2013.01); *H03M 13/1108* (2013.01)

(58) Field of Classification Search
CPC ............ H03M 13/1108; G06F 13/1668; G06F 11/0772; G06F 11/076; G06F 11/1068
See application file for complete search history.

(56) References Cited

U.S. PATENT DOCUMENTS

2012/0216095 A1   8/2012  Ha
2015/0066819 A1   3/2015  Mozak et al.
2015/0378826 A1* 12/2015  Zhang ................... G06F 3/0673
                                                                714/766

(Continued)

OTHER PUBLICATIONS

Communication dated Aug. 5, 2022 issued by the European Patent Office in European Application No. 22158210.9.

(Continued)

*Primary Examiner* — Guy J Lamarre
(74) *Attorney, Agent, or Firm* — Sughrue Mion, PLLC

(57) ABSTRACT

A memory device, and an operating method of the memory device and a host device are provided. The method of operating a memory device includes receiving a command for requesting an Eye Open Monitor (EOM) operation performance from a host device, receiving pattern data including data and non-data from the host device, performing the EOM operation which performs an error count to correspond to the data, and does not perform the error count on the non-data, and transmitting an EOM response signal including the error count result to the host device.

20 Claims, 23 Drawing Sheets

(56) References Cited

U.S. PATENT DOCUMENTS

| | | | |
|---|---|---|---|
| 2016/0209462 A1 | 7/2016 | Choi et al. | |
| 2019/0391761 A1* | 12/2019 | Brief | G06F 3/0656 |
| 2022/0165314 A1* | 5/2022 | Kang | G11C 29/50 |
| 2022/0332330 A1* | 10/2022 | Kang | B60W 60/00 |
| 2022/0391141 A1* | 12/2022 | Hong | G06F 3/0604 |

OTHER PUBLICATIONS

Communication dated Aug. 23, 2022 issued by the European Patent Office in European Application No. 22 158 210.9.

* cited by examiner

| Byte\Bit | 7 | 6 | 5 | 4 | 3 | 2 | 1 | 0 |
|---|---|---|---|---|---|---|---|---|
| 0 | Operation code (3Bh) ||||||||
| 1 | Reserved ||| Mode = 1Fh |||||
| 2 | BUFFER ID ||||||||
| 3 | (MSB) ||||||||
| 4 | BUFFER OFFSET ||||||||
| 5 | (LSB) ||||||||
| 6 | (MSB) ||||||||
| 7 | PARAMETER LIST LENGTH ||||||||
| 8 | (LSB) ||||||||
| 9 | Control = 00h ||||||||

FIG. 11

| MODE | DESCRIPTION |
|------|-------------|
| 00h  | Not used in UFS |
| 01h  | Vendor Specific |
| 02h  | Data |
| ...  | Not used in UFS |
| 0Eh  | Download microcode with offsets, save and defer active |
| ...  | Not used in UFS |
| 1Dh  | Reserved |
| 1Eh  | Reserved |
| 1Fh  | EYE OPEN MONITOR |

FIG. 12

| Byte \ Bit | 7 | 6 | 5 | 4 | 3 | 2 | 1 | 0 | |
|---|---|---|---|---|---|---|---|---|---|
| 0 | (MSB) | | | | | | | | ⎫ |
| 1 | | | EOM DATA LENGTH (N-11) | | | | | | |
| 2 | | | | | | | | (LSB) | |
| 3 | PHASE SELECT | | | | | | | | |
| 4 | VREF CONTROL | | | | | | | | ⎬ EDH |
| 5 | NUMBER OF SAMPLING | | | | | | | | |
| 6 | VREF RESOLUTION | | | | PHASE RESOLUTION (GEAR) | | | | |
| 7 | Reserved = 00h | | | | | | | | |
| 8 | Reserved = 00h | | | | | | | | |
| 9 | Reserved = 00h | | | | | | | | |
| 10 | Reserved = 00h | | | | | | | | |
| 11 | Reserved = 00h | | | | | | | | ⎭ |

| 12 | Data[0] | ⎫ |
|---|---|---|
| ... | ... | ⎬ EDP |
| N | Data[EOM DATA LENGTH - 1] | ⎭ |

FIG. 14

| Byte \ Bit | 7 | 6 | 5 | 4 | 3 | 2 | 1 | 0 | |
|---|---|---|---|---|---|---|---|---|---|
| 0 | (MSB) | | | | | | | | |
| 1 | | | Total Data Length (N+1) | | | | | | |
| 2 | | | | | | | | (LSB) | |
| 3 | (MSB) | | | | | | | | |
| 4 | | | EOM Data Pattern Length (N−11) | | | | | | |
| 5 | | | | | | | | (LSB) | EDH |
| 6 | Timing Step | | | | | | | | |
| 7 | Voltage Step | | | | | | | | |
| 8 | Number of Sampling | | | | | | | | |
| 9 | Timing Offset | | | | | | | | |
| 10 | Voltage Offset | | | | | | | | |
| 11 | Reserved 1 | | | | | | | | |
| 12 | | | | | | | | | |
| 13 | | | | | | | | | |
| 14 | | | | | | | | | |
| 15 | | | | | | | | | |
| 16 | | | | | | | | | |
| 17 | | | | | | | | | |
| 18 | | | | | | | | | |
| 19 | EOM Data Pattern | | | | | | | | EDP |
| 20 | | | | | | | | | |
| 21 | | | | | | | | | |
| 8 | | | | | | | | | |
| N−2 | | | | | | | | | |
| ... | | | | | | | | | |
| N | | | | | | | | | |

FIG. 16

Response UPIU

| | 0 | 1 | 2 | 3 |
|---|---|---|---|---|
| 0 | xx10 0001b | Flags | LUN | Task Tag |
| 4 | IID \| Command Set Type | Reserved | Response | Status |
| 8 | Total EHS Length (00h) | Device Information | Data Segment Length | |
| 12 | (MSB) Residual Transfer Count | | | 15 (LSB) |
| 16 | Reserved | | | 19 |
| 20 | Reserved | | | 23 |
| 24 | Reserved | | | 27 |
| 28 | Reserved | | | 31 |
| | Header E2ECRC (omit if HD=0) | | | |
| k | Sense Data Length | | Sense Data[0] | Sense Data[1] |
| k+4 | Sense Data[2] | Sense Data[3] | Sense Data[4] | Sense Data[5] |
| k+16 | Sense Data[14] | Sense Data[15] | Sense Data[16] | Sense Data[17] |
| | Data E2ECRC (omit if DD=0) | | | |

NOTE 1 k = 32 if HD = 0.

250

| Sync Header | Type |
| --- | --- |
| 00 | considered invalid and treated as error |
| 01 | carries data |
| 10 | control characters only |
| 11 | considered invalid and treated as error |

MEMORY DEVICE AND OPERATING METHOD OF THE MEMORY DEVICE AND HOST DEVICE

This application claims priority to Korean Patent Application No. 10-2021-0050328 filed on Apr. 19, 2021 in the Korean Intellectual Property Office, the disclosure of which is incorporated by reference herein in its entirety.

BACKGROUND

1. Technical Field

The present disclosure relates to a memory device, and an operating method of the memory device and a host device.

2. Related Art

An Eye Open Monitor (EOM) is used to grasp quality characteristics of signals transmitted to and received from a channel. In general, received signals from the channel include time-varying voltages, that is, waveforms. For example, an eye of a signal received at a signal receiving end of a memory system (e.g., a receiver of the memory device) may be measured to improve the quality of signal transmission and reception between the memory device and the host device.

The EOM receives pattern data and is performed by the use of the received pattern data. At this time, the pattern data includes a data symbol used for information delivery, a control symbol for controlling transmission and reception of the signal, a filler symbol for maintaining locking of a Phase Lock Loop (PLL) of the receiving end and the like.

When the EOM is performed on the basis of non-data symbols such as the control symbol and the filler symbol, the EOM results do not properly reflect the actual channel characteristics and the reliability of the EOM results may be degraded. There is a need for a research for improving this problem accordingly.

SUMMARY

One or more example embodiments provide an operating method of a memory device that may improve the reliability of EOM result.

One or more example embodiments also provide an operating method of a host device that may improve the reliability of EOM result.

One or more example embodiments also provide a memory device in which the reliability of EOM result is improved.

According to an aspect of an example embodiment, there is provided a method of operating a memory device, the method including: receiving, from a host device, a command requesting an EOM (Eye Open Monitor) operation; receiving pattern data including one or more data symbols and one or more non-data symbols from the host device, wherein the one or more data symbols includes an information symbol and/or a pattern symbol; counting, in an error count and as part of the EOM operation, first errors corresponding to the one or more data symbols; not counting, in the error count, second errors corresponding to the one or more non-data symbols; and transmitting, to the host device, an EOM response signal including the error count.

Also provided herein is a method of operating a host device, the method including: transmitting, to a memory device, a command requesting an EOM operation; transmitting pattern data including one or more data symbols and one or more non-data symbols to the memory device; and receiving, from the memory device, an EOM response signal including an error count associated with the pattern data, wherein the error count is based on the one or more data symbols and is not based on the non-data symbols.

According to an aspect of an example embodiment, there is provided a memory device including: an interfacing device; and a device controller configured to control an operation of the interfacing device, wherein the interfacing device is configured to: receive a command requesting an EOM operation, receive, from a host device, pattern data including one or more data symbols and one or more non-data symbols, wherein the one or more data symbols includes an information symbol and/or a pattern symbol, perform an EOM operation by operations including: counting, in an error count and as part of the EOM operation, first errors corresponding to the one or more data symbols, and not counting, in the error count, second errors corresponding to the one or more non-data symbols, and transmit, to the host device, an EOM response signal including the error count.

According to an aspect of an example embodiment, there is provided a data receiving device including: an interfacing device; and a controller configured to control an operation of the interfacing device, wherein the interfacing device is configured to receive a command requesting an EOM operation, receiving pattern data including one or more data symbols and one or more non-data symbols from a data transmission device, wherein the one or more data symbols includes an information symbol and/or a pattern symbol; counting, in an error count and as part of the EOM operation, first errors corresponding to the one or more data symbols; not counting, in the error count, second errors corresponding to the one or more non-data symbols; and transmitting, to the data transmission device, an EOM response signal including the error count.

Embodiments are described in the detailed description given below.

BRIEF DESCRIPTION OF THE DRAWINGS

The above and/or other aspects and features of the present disclosure will become more apparent by describing in detail example embodiments thereof referring to the attached drawings, in which:

FIG. 9 is a flowchart for explaining the operation of the memory system according to some embodiments;

FIGS. 10 to 16 are diagrams for explaining the operation of the memory system according to some embodiments;

DETAILED DESCRIPTION

Hereinafter, example embodiments will be described referring to the accompanying drawings.

Figure 1:
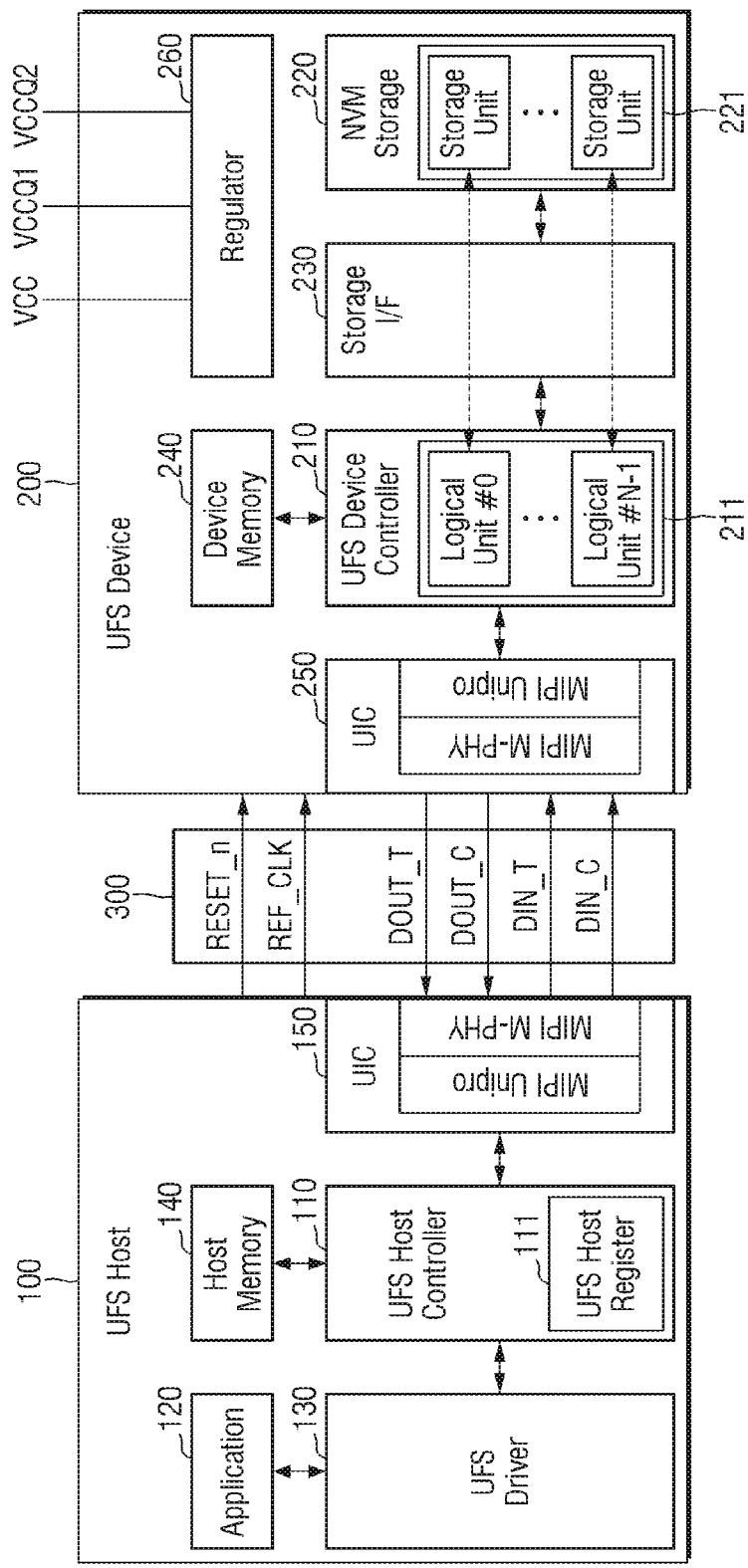
FIG. 1 is a diagram showing a memory system according to some embodiments.
Figure 2:
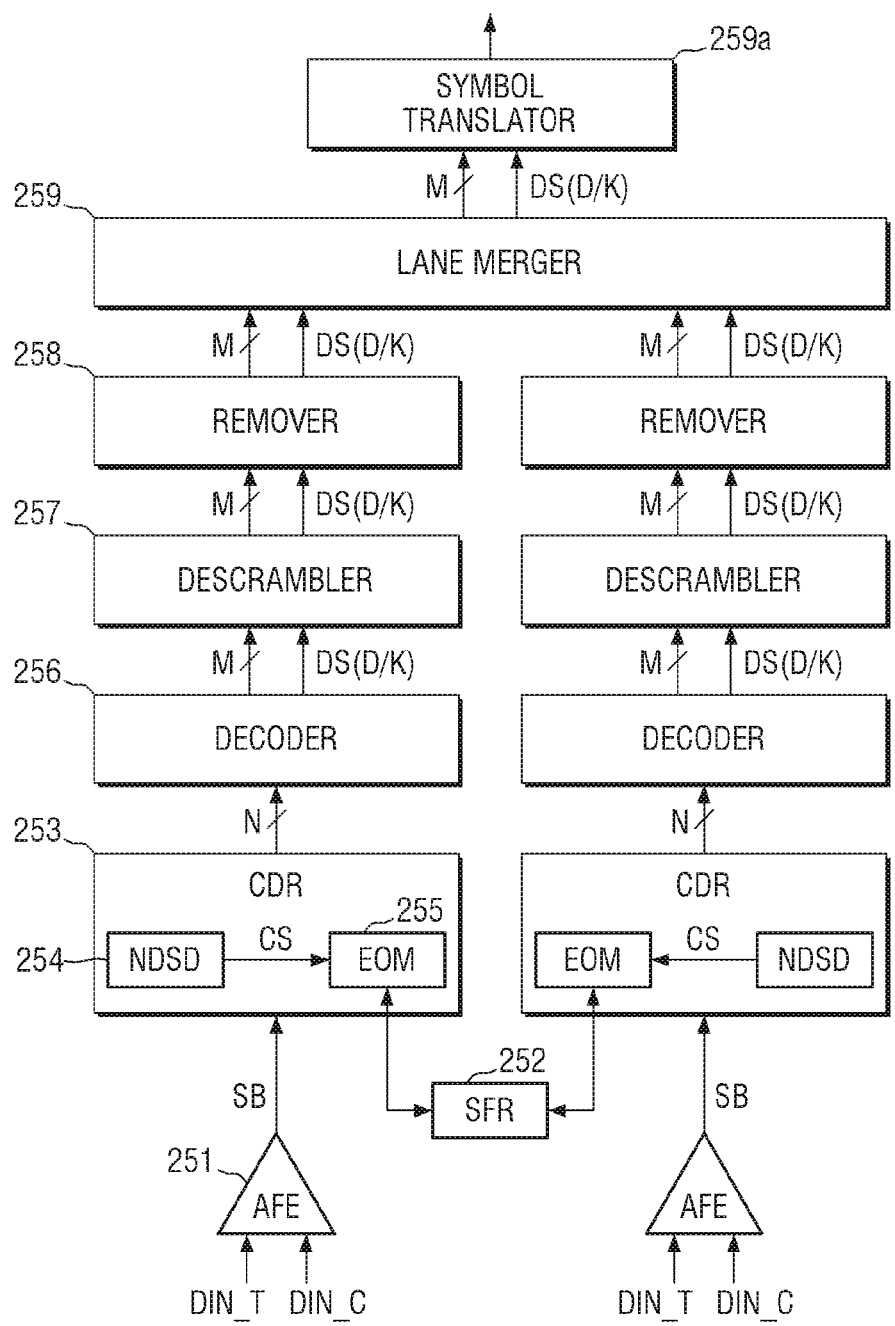
FIG. 2 is a diagram showing a UIC (UFS interconnect) layer of FIG. 1, according to some embodiments.
Figure 3:
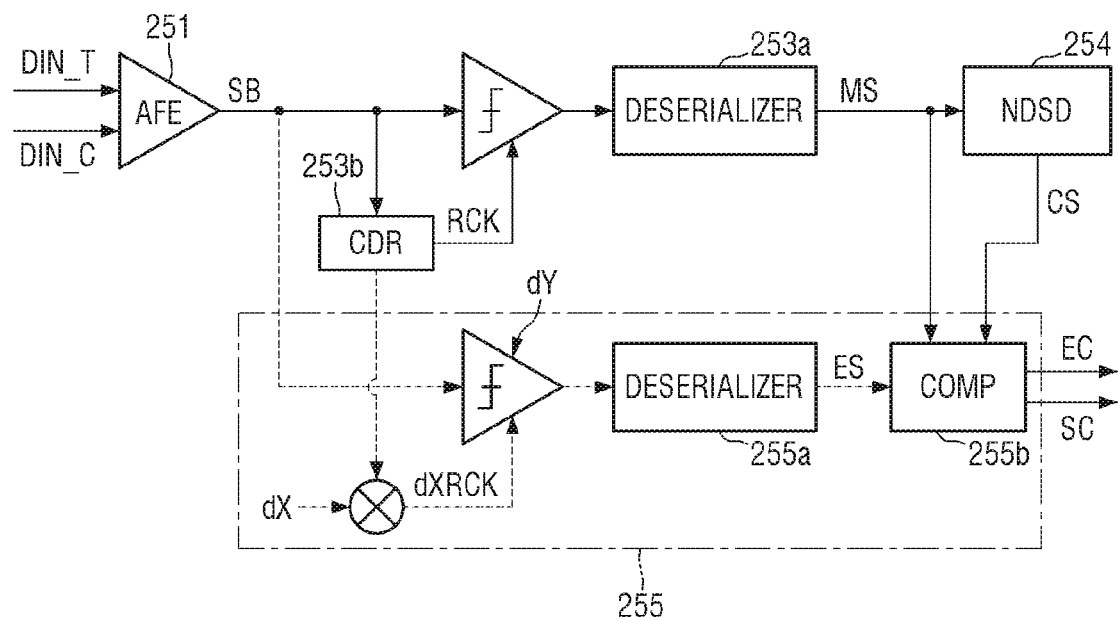
FIG. 3 is a diagram showing a CDR block of FIG. 2, according to some embodiments.
Figure 4:
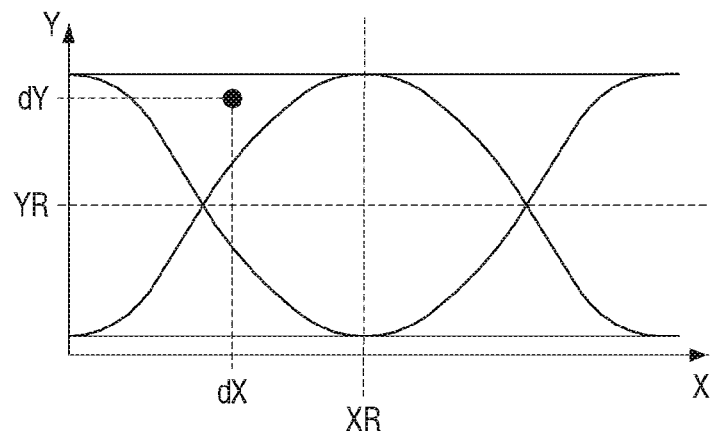
FIG. 4 is a diagram for explaining an EOM operation, according to some embodiments.
Figure 5:
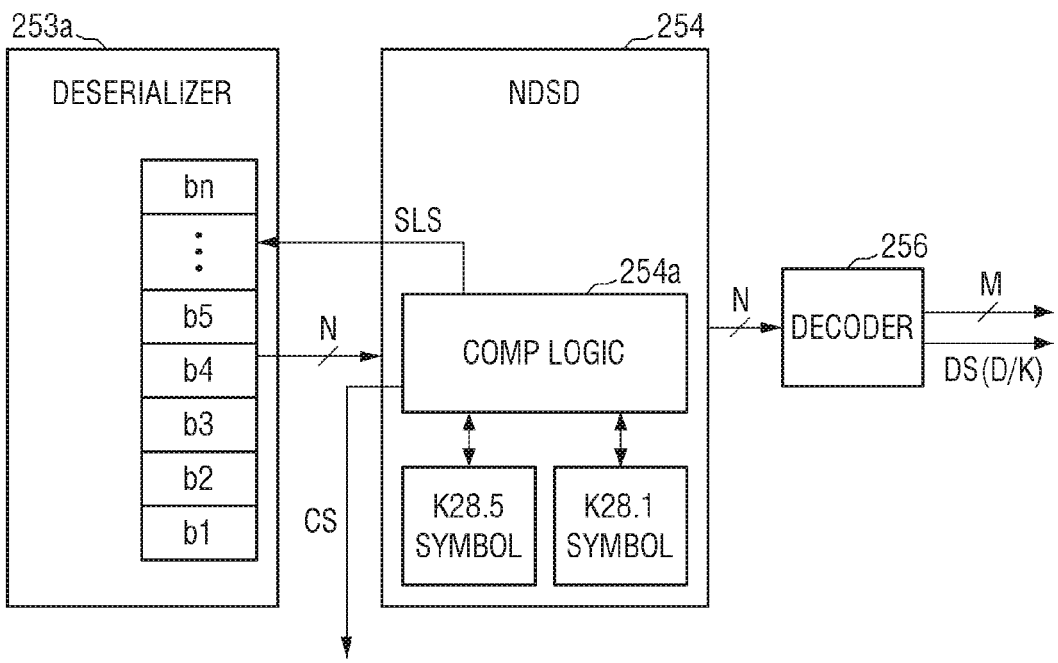
FIG. 5 is a diagram showing a non-data symbol detector of FIG. 3, according to some embodiments.

FIG. 1 is a diagram showing a memory system according to some embodiments. FIG. 2 is a diagram showing a Universal Flash Storage (UFS) interconnect (UIC) layer of FIG. 1. FIG. 3 is a diagram showing a clock data recovery (CDR) block of FIG. 2. FIG. 4 is a diagram for explaining an EOM operation. FIG. 5 is a diagram showing a non-data symbol detector of FIG. 3.

Hereinafter, a memory system will be described by taking an example of a system that complies with a UFS standard announced at Joint Electron Device Engineering Council (JEDEC). However, embodiments are not limited thereto, and the aspects of the memory system implemented within the same technical idea may be implemented with various modifications.

Referring to FIG. 1, the UFS system 1 may include a host device 100, a memory device 200, and a UFS interface 300.

The host device 100 and the memory device 200 may be connected to each other through the UFS interface 300. In some embodiments, the host device 100 may be implemented as a part of an application processor.

The host device 100 may include a UFS host controller 110, an application 120, a UFS driver 130, a host memory 140, and a UIC layer 150.

The memory device 200 may include a UFS device controller 210, a non-volatile storage 220, a storage interface 230, a device memory 240, a UIC layer 250, and a regulator 260.

The non-volatile storage 220 may be made up of a plurality of storage units 221. Although such a storage unit 221 may include a V-NAND flash memory of 2D structure or 3D structure, it may also include other types of non-volatile memory such as a PRAM and/or a RRAM.

The UFS device controller 210 and the non-volatile storage 220 may be connected to each other through the storage interface 230. The storage interface 230 may be implemented to comply with standards such as Toggle or ONFI. The operation between the UFS device controller 210 and the non-volatile storage 220 using the Toggle will be described later.

The application 120 may be a program that wants to communicate with the memory device 200 to utilize the functions of the memory device 200. The application 120 may transmit an input-output request (IOR) to the UFS driver 130 for input and output to and from the memory device 200. The input-output request (IOR) may mean, but is not necessarily limited to, data read request, write request and/or erase request, or the like.

The UFS driver 130 may manage the UFS host controller 110 through a UFS-HCI (host controller interface). The UFS driver 130 may convert the input-output request generated by the application 120 into UFS command defined by the UFS standard, and may send the converted UFS command to the UFS host controller 110. A single input-output request may be converted into a plurality of UFS commands. The UFS commands may basically be commands defined by a Small Computer System Interface (SCSI) standard, but may also be UFS standard-only commands.

The UFS host controller 110 may transmit the UFS commands converted by the UFS driver 130 to the UIC layer 250 of the memory device 200 through the UIC layer 150 and the UFS interface 300. In this procedure, the UFS host register 111 of the UFS host controller 110 may act as a command queue (CQ).

The UIC layer 150 on the host device 100 side may include a MIPI M-PHY and a MIPI UniPro, and the UIC layer 250 on the memory device 200 side may also include a MIPI M-PHY and a MIPI UniPro.

The UFS interface 300 may include a line that transmits a reference clock REF_CLK, a line that transmits a hardware reset signal RESET_n of the memory device 200, a pair of lines that transmits differential input signal pairs DIN_T and DIN_C, and a pair of lines that transmits differential output signal pairs DOUT_T and DOUT_C.

A frequency value of the reference clock provided from the host device 100 to the memory device 200 may be, but is not necessarily limited to, one of four values of 19.2 MHz, 26 MHz, 38.4 MHz and 52 MHz. The host device 100 may change the frequency value of the reference clock even during operation, that is, even during data transmission and reception between the host device 100 and the memory device 200.

The memory device 200 may generate clocks of various frequencies from the reference clock provided from the host device 100, by utilizing a phase-locked loop (PLL) or the like. Further, the host device 100 may set a data rate value between the host device 100 and the memory device 200 through the frequency value of the reference clock. That is, the value of the data rate may be determined depending on the frequency value of the reference clock.

The UFS interface 300 may support a plurality of lanes, and each lane may be implemented as a differential pair. For example, the UFS interface 300 may include one or more receive lanes and one or more transmit lanes. In FIG. 1, the pair of lines that transmits the differential input signal pairs DIN_T and DIN_C may constitute the receive lane, and the pair of lines that transmits the differential output signal pairs DOUT_T and DOUT_C may constitute the transmit lane, respectively. In FIG. 1, although one transmit lane and one receive lane are shown, the number of transmit lanes and receive lanes may be modified.

The receive lane and the transmit lane may transmit the data in a serial communication manner, and a full-duplex type communication between the host device 100 and the memory device 200 is enabled by a structure in which the receive lane and the transmit lane are separated. That is, the memory device 200 may transmit data to the host device 100 through the transmit lane, even while receiving the data from the host device 100 through the receive lane. Also, control data such as command from the host device 100 to the memory device 200, and user data to be stored in the non-volatile storage 220 of the memory device 200 or to be read from the non-volatile storage 220 by the host device 100 may be transmitted through the same lane. Accordingly, it is not necessary to further provide a separate lane for data transmission, in addition to the pair of transmit lanes and the pair of receive lanes, between the host device 100 and the memory device 200.

Referring to FIG. 2, the UIC layer 250 may include an equalizer 251 including an analog front end (AFE), a CDR block 253, a decoder 256, a descrambler 257, a symbol remover 258, a lane merger 259, and a symbol translator 259a.

The equalizer 251 receives differential input signal pairs DIN_T and DIN_C from the host device (100 of FIG. 1), and may perform equalizing to output serial bits SB. In some embodiments, the host device (100 of FIG. 1) provides differential input signal pairs DIN_T and DIN_C which are serial signals to the equalizer 251, and the equalizer 251 may output the serial bit SB from it.

The CDR block 253 may perform clock data recovery (CDR) and data deserialize to output N-bit (N is a natural number) signal. The CDR block 253 may include an EOM block 255 that performs the EOM operation to measure the signal quality of the communication channel with the host device (100 of FIG. 1), and a non-data symbol detector 254 that controls the performance of the EOM operation of the EOM block 255.

In some embodiments, although the EOM operation performed in the CDR block 253 may be performed using, for example, an SFR (Special Function Register) 252, the embodiments are not limited thereto.

Referring to FIGS. 2 and 3, the EOM operation performed in the CDR block 253 may be performed by measuring the quality of the signal received from the host device 100, using the SFR 252 under specific offset conditions. In general, the received signal is a waveform including information symbols, pattern symbols and/or non-data symbols.

Specifically, the EOM operation may be performed by comparing a main path signal MS of a main path indicated by a solid line in FIG. 3 with an EOM path signal ES of an EOM path indicated by a dotted line in FIG. 3.

The main path may recover the clock from a serial bit SB received from the host device 100 and passing through the equalizer 251, using a clock recovery circuit 253b, extract data of the serial bit SB using the recovered clock RCK, and then generate a main path signal MS through the deserializer 253a. The main path signal MS thus generated may be sent to the comparator 255b.

The EOM path may generate a clock dxRCK which reflects a specific offset value dX on the clock RCK recovered from the serial bit SB received from the host device 100 and passing through the equalizer 251, extract data of the serial bit SB by reflecting the clock dxRCK and the specific offset value dY, and then generate an EOM path signal ES through the deserializer 255a. The EOM path signal ES thus generated may be sent to the comparator 255b.

For example, the main path signal MS may be data extracted from the reference conditions XR and YR of FIG. 4, and the EOM path signal ES may be data extracted from the offset conditions dX and dY of FIG. 4.

When the EOM path signal ES is recognized as the same signal as the main path signal MS, the comparator 255b does not output the error count signal EC. When the EOM path signal ES is not recognized as the same signal as the main path signal MS, the comparator 255b may output the error count signal EC. That is, the error counting may be performed by the error count EC that is output to the comparator 255b.

Further, the comparator 255b may output a sampling count signal SC each time such sampling (for example, comparison of the EOM path signal ES and the main path signal MS) is performed once.

In some embodiments, an offset value dX may include a time offset value, a phase offset value, and the like, and an offset value dY may include a voltage offset, or the like. However, the embodiments are not limited thereto.

In some embodiments, although the offset dX, the offset dY, the error count value according to the error count signal EC, the sampling number information according to the sampling count signal SC, and the like may be stored in the SFR 252, the embodiments are not limited thereto.

The non-data symbol detector 254 monitors the main path signal MS through the deserializer 253a, and when the received data is a filler symbol, the non-data symbol detector 254 may apply a control signal CS that stops the output of the error count signal EC to the comparator 255b. That is, when the received data is a filler symbol, the non-data symbol detector 254 may stop the operation of the comparator 255b so that the EOM error counting is not performed on the filler symbol.

The host device 100 may transmit the filler symbol while the data symbol used for information delivery is not transmitted to maintain the PLL locking of the memory device 200. In some cases, a proportion of filler symbol may be much larger than the data symbol in the pattern data received from the host device 100. A data symbol may be referred to herein as an information symbol or as a pattern symbol. The pattern data may be referred to herein as a waveform. The received pattern data, that is, the received waveform, may include information symbols, pattern symbols and/or non-data symbols. Incidentally, since such a filler symbol is an artificially generated symbol for maintaining the PLL locking, when performing the EOM error counting on the filler symbol, accurate quality evaluation may not be performed on the data symbol transmission environment. That is, the reliability of the EOM result may be degraded. Therefore, in this embodiment, when the received symbol is the filler symbol other than the data symbol, by stopping the error counting thereof to exclude the filler symbol from the final EOM result, reliability of the EOM result may be improved. In general, a highly random sequence of symbols is good for the EOM function. User information symbols may provide this randomness, or the host 100 or the device 200 may store a table of random symbols.

In some embodiments, the comparator 255b may also stop the output of the sampling count signal SC when the control signal CS is received from the non-data symbol detector 254. That is, when the control signal CS is received from the non-data symbol detector 254, the comparator 255b stops both the outputs of the error count signal EC and the sampling count signal SC, thereby completely excluding the EOM operation of the filler symbol.

Referring to FIG. 5, the non-data symbol detector 254 may include a comparison logic 254a which receives the N-bit signal output from the deserializer 253a and determines whether the N-bit signal is a predetermined symbol. In some embodiments, although the N-bit signal may be a 10-bit signal, the embodiments are not limited thereto.

In some embodiments, the comparison logic 254a may determine whether the N-bit signal is a K28.5 symbol, which means the start of signal reception. Specifically, when the N-bit signal is a 10-bit signal, the comparison logic 254a determines whether the input signal is a K28.5 symbol which is 0011111010 or 1100000101, and may provide the symbol locking signal SLS to the deserializer 253a when the input signal corresponds to the K28.5 symbol.

Further, the comparison logic 254a may determine whether the N-bit signal is a K28.1 symbol which means filler data. Specifically, when the N-bit signal is a 10-bit signal, the comparison logic 254a determines whether the input signal is the K28.1 symbol which is 0011111000 or 1100000110, and may provide the comparator 255b with a control signal CS that stops the error count performing operation, when corresponding to the K28.1 symbol. Accordingly, the comparator 255b may not perform the EOM operation on the filler symbol.

Referring to FIG. 2 again, the decoder 256 may decode the N-bit signal which is output from the CDR block 253 to an M-bit (M is a natural number greater than N) signal and a distinction signal DS. In some embodiments, although the N-bit signal may be a 10-bit signal and the M-bit signal may be a 8-bit signal, the embodiments are not limited thereto.

When the input N-bit signal is a data symbol, the decoder 256 may output the data signal D as the distinction signal DS. When the input N-bit signal is a control symbol, the decoder 256 may output the control signal K as the distinction signal DS.

The descrambler 257 may perform descrambling on the input M-bit signal and output it. The symbol remover 258 may remove skip symbol such as a marker and a filler symbol from the input M-bit signal. The lane merger 259 may merge the signals input to each lane and provide them to the symbol translator 259a. The symbol translator 259a may translate and output the symbols.

Referring to FIG. 1 again, the UFS device controller 210 of the memory device 200 may generally control the operation of the memory device 200.

The UFS device controller 210 may manage the non-volatile storage 220 through a LU (logical unit) 211, which is a logical storage unit of data. Although the number of LUs 211 may be, for example, eight, the embodiments are not limited thereto.

The UFS device controller 210 may include a flash translation layer (FTL), and may convert a logical data address sent from the host device 100, for example, an LBA (logical block address), into a physical data address, for example, a PBA (physical block address) or a PPN (physical page number), using the address mapping information of the FTL. In the UFS system 1, the logical block for storing user data may have a size of a predetermined range. For example, the minimum size of the logical block may be set to 4 Kbyte.

When a command from the host device 100 is input to the memory device 200 through the UIC layer 250, the UFS device controller 210 performs an operation according to the input command, and may transmit the completion response to the host device 100 when the operation is completed.

For example, when the host device 100 tries to store user data in the memory device 200, the host device 100 may transmit a data write command to the memory device 200. When a response which is ready to receive the user data (ready-to-transfer) is received from the memory device 200, the host device 100 may transmit the user data to the memory device 200. The UFS device controller 210 temporarily stores the transmitted user data in the device memory 240, and may store the user data temporarily stored in the device memory 240 at a selected position of the non-volatile storage 220 on the basis of the address mapping information of the FTL.

As still another example, when the host device 100 tries to read user data stored in the memory device 200, the host device 100 may transmit the data read command to the memory device 200. When receiving the command, the UFS device controller 210 reads the user data from the non-volatile storage 220 on the basis of the data read command, and may temporarily store the read user data in the device memory 240. In such a read procedure, the UFS device controller 210 may detect and correct errors of the read user data, using a built-in ECC (error correction code) circuit (not shown). Further, the UFS device controller 210 may transmit the user data temporarily stored in the device memory 240 to the host device 100.

Furthermore, the UFS device controller 210 may further include an AES (advanced encryption standard) circuit (not shown), and the AES circuit may encrypt or decrypt data which is input to the UFS device controller 210, using a symmetric-key algorithm.

The host device 100 may store the commands to be transmitted to the memory device 200 in order in the UFS host register 111 which may function as a command queue, and transmit the commands to the memory device 200 in that order. At this time, the host device 100 may transmit the next command waiting in the command queue to the memory device 200, even when the previously transmitted command is still being processed by the memory device 200, that is, even before receiving the notification that the previously transmitted command is completely processed by the memory device 200. Accordingly, the memory device 200 may also receive the next command from the host device 100, even while processing the previously transmitted command. The maximum number of commands (queue depth) that may be stored in such a command queue may be, for example, thirty two. In addition, the command queue may be implemented as a circular queue type that indicates a start and an end of a command row stored in the queue through a head pointer and a tail pointer.

Each of the plurality of storage units 221 may include a memory cell array (not shown), and a control circuit (not shown) that controls the operation of the memory cell array. The memory cell array may include a two-dimensional memory cell array or a three-dimensional memory cell array. The memory cell array includes a plurality of memory cells, and each memory cell may be a cell (single level cell, SLC) that stores 1-bit information, but each memory cell may also be a cell that stores 2-bits or more information, such as a MLC (multi level cell), a TLC (triple level cell), and a QLC (quadruple level cell). A three-dimensional memory cell array may include a vertical NAND string which is vertically oriented so that at least one memory cell is located above another memory cell. More specific description thereof will be provided below.

VCC, VCCQ1, VCCQ2, and the like as a power supply voltage may be input to the memory device 200. The VCC is a main power supply voltage for the memory device 200, and may have, for example, a value of 2.4 to 3.6V. A VCCQ1 is a power supply voltage for supplying voltage of a low range, is mainly for the UFS device controller 210, and may include, for example, a value of 1.14 and 1.26V. A VCCQ2 is a power supply voltage for supplying a voltage of a range lower than the VCC but higher than the VCCQ1, is mainly for input-output interfaces such as MIPI M-PHY 251, and may include, for example, a value of 1.7 to 1.95V. The power supply voltages may be supplied for each component of the memory device 200 via the regulator 260. The regulator 260 may be implemented as a set of unit regulators, each connected to different ones among the aforementioned power supply voltages.

Figure 6:
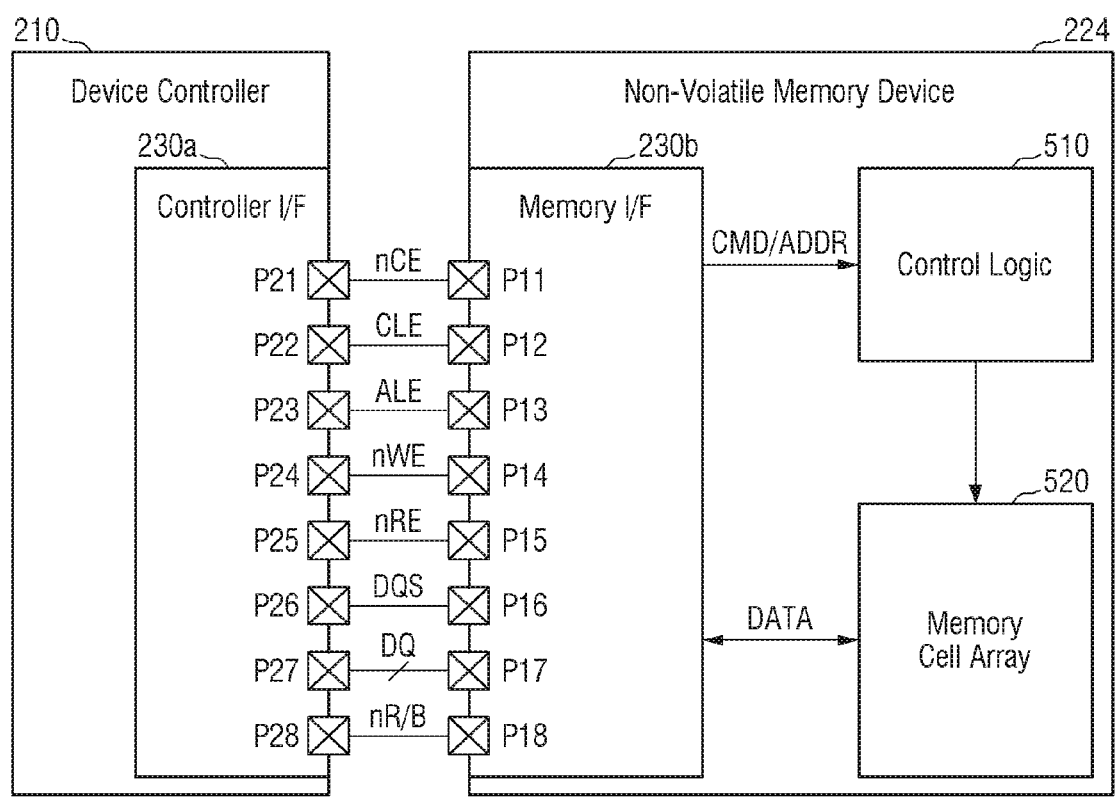
FIG. 6 is a diagram in which a UFS device controller, a storage interface, and a non-volatile storage of FIG. 1 are reconfigured, according to some embodiments.

FIG. 6 is a diagram in which the UFS device controller, the storage interface, and the non-volatile storage of FIG. 1 are reconfigured.

The storage interface 230 of FIG. 1 may include a controller interface circuit 230a and the memory interface circuit 230b of FIG. 6. In some embodiments, the storage device 224 shown in FIG. 6 may correspond to the single storage unit 221 of FIG. 1. Also, in some embodiments, the storage device 224 may correspond to the non-volatile storage 220 of FIG. 1.

The storage device 224 may include first to eighth pins P11 to P18, a memory interface circuit 230b, a control logic circuit 510, and a memory cell array 520.

The memory interface circuit 230b may receive a chip enable signal nCE from the device controller 210 through the first pin P11. The memory interface circuit 230b may transmit and receive signals to and from the device controller 210 through second to eighth pins P12 to P18 in accordance with the chip enable signal nCE. For example, when the chip enable signal nCE is in an enable status (e.g., a low level), the memory interface circuit 230b may transmit and receive signals to and from the device controller 210 through second to eighth pins P12 to P18.

The memory interface circuit 230b may receive a command latch enable signal CLE, an address latch enable signal ALE, and a write enable signal nWE from the device controller 210 through second to fourth pins P12 to P14. The memory interface circuit 230b may receive the data signal DQ from the device controller 210 or transmit the data signal DQ to the device controller 210 through the seventh pin P17. The command CMD, the address ADDR, and the data may be sent through the data signal DQ. For example, the data signal DQ may be sent through a plurality of data signal lines. In this case, the seventh pin P17 may include a plurality of pins corresponding to the plurality of data signals.

The memory interface circuit 230b may acquire the command CMD from the data signal DQ received in an enable section (e.g., a high level status) of the command latch enable signal CLE on the basis of toggle timings of the write enable signal nWE. The memory interface circuit 230b may acquire the address ADDR from the data signal DQ received in the enable section (e.g., a high level status) of the address latch enable signal ALE on the basis of the toggle timings of the write enable signal nWE.

In some embodiments, the write enable signal nWE holds a static status (e.g., a high level or a low level) and then may be toggled between the high level and the low level. For example, the write enable signal nWE may be toggled at the section in which the command CMD or the address ADDR is transmitted. Accordingly, the memory interface circuit 230b may acquire the command CMD or the address ADDR on the basis of the toggle timings of the write enable signal nWE.

The memory interface circuit 230b may receive a read enable signal nRE from the device controller 210 through the fifth pin P15. The memory interface circuit 230b may receive a data strobe signal DQS from the device controller 210 through a sixth pin P16, or may transmit the data strobe signal DQS to the device controller 210.

In a data DATA output operation of the storage device 224, the memory interface circuit 230b may receive the toggling read enable signal nRE through the fifth pin P15 before outputting the data DATA. The memory interface circuit 230b may generate the toggling data strobe signal DQS on the basis of the toggling of the read enable signal nRE. For example, the memory interface circuit 230b may generate the data strobe signal DQS that starts to toggle after a predetermined delay (e.g., tDQSRE) on the basis of the toggling start time of the read enable signal nRE. The memory interface circuit 230b may transmit the data signal DQ including the data DATA on the basis of the toggle timing of the data strobe signal DQS. Accordingly, the data DATA may be arranged at the toggle timing of the data strobe signal DQS and transmitted to the device controller 210.

In a data DATA input operation of the storage device 224, when the data signal DQ including the data DATA is received from the device controller 210, the memory interface circuit 230b may receive the toggling data strobe signal DQS together with the data DATA from the device controller 210. The memory interface circuit 230b may acquire the data DATA from the data signal DQ on the basis of the toggle timing of the data strobe signal DQS. For example, the memory interface circuit 230b may acquire the data DATA by sampling the data signal DQ at a rising edge and a falling edge of the data strobe signal DQS.

The memory interface circuit 230b may transmit a ready/busy output signal nR/B to the device controller 210 through an eighth pin P18. The memory interface circuit 230b may transmit the status information of the storage device 224 to the device controller 210 through the ready/busy output signal nR/B. When the storage device 224 is in a busy status (that is, when the internal operations of the storage device 224 are being performed), the memory interface circuit 230b may transmit the ready/busy output signal nR/B indicating the busy status to the device controller 210. When the storage device 224 is in a ready status (i.e., the internal operations of the storage device 224 are not performed or are completed), the memory interface circuit 230b may transmit the ready/busy output signal nR/B indicating the ready status to the device controller 210. For example, while the storage device 224 reads the data DATA from the memory cell array 520 in response to a page read command, the memory interface circuit 230b may transmit the ready/busy output signal nR/B indicating the busy status (e.g., a low level) to the device controller 210. For example, while the storage device 224 programs the data DATA to the memory cell array 520 in response to the program command, the memory interface circuit 230b may transmit the ready/busy output signal nR/B indicating the busy status to the device controller 210.

The control logic circuit 510 may generally control various operations of the storage device 224. The control logic circuit 510 may receive the command/address CMD/ADDR acquired from the memory interface circuit 230b. The control logic circuit 510 may generate control signals for controlling other components of the storage device 224 in accordance with the received command/address CMD/ADDR. For example, the control logic circuit 510 may generate various control signals for programing the data DATA in the memory cell array 520 or reading the data DATA from the memory cell array 520.

The memory cell array 520 may store the data DATA acquired from the memory interface circuit 230b under the control of the control logic circuit 510. The memory cell array 520 may output the stored data DATA to the memory interface circuit 230b under the control of the control logic circuit 510.

The memory cell array 520 may include a plurality of memory cells. For example, a plurality of memory cells may be flash memory cells. However, embodiments are not limited thereto, and the memory cells may be RRAM (Resistive Random Access Memory) cells, FRAM (Ferroelectric Random Access Memory) cells, PRAM (Phase Change Random Access Memory) cells, TRAM (Thyristor Random Access Memory) cells, and MRAM (Magnetic Random Access Memory) cells. Hereinafter, embodiments will be described mainly on the basis of an embodiment in which the memory cells are NAND flash memory cells.

The device controller 210 may include first to eighth pins P21 to P28, and a controller interface circuit 230a. The first to eighth pins P21 to P28 may correspond to the first to eighth pins P11 to P18 of the storage device 224.

The controller interface circuit 230a may transmit the chip enable signal nCE to the storage device 224 through a first pin P21. The controller interface circuit 230a may transmit and receive signals to and from the storage device 224 selected through the chip enable signal nCE, through the second to eighth pins P22 to P28.

The controller interface circuit 230a may transmit the command latch enable signal CLE, the address latch enable signal ALE, and the write enable signal nWE to the storage device 224 through the second to fourth pins P22 to P24. The controller interface circuit 230a may transmit the data signal DQ to the storage device 224 or receive the data signal DQ from the storage device 224 through a seventh pin P27.

The controller interface circuit 230a may transmit the data signal DQ including the command CMD or the address ADDR to the storage device 224 along with a toggling write enable signal nWE. The controller interface circuit 230a may transmit the data signal DQ including the command CMD to the storage device 224 with transmission of the command latch enable signal CLE having the enable status, and may transmit the data signal DQ including the address ADDR to the storage device 224 with transmission of the address latch enable signal ALE having the enable status.

The controller interface circuit 230a may transmit the read enable signal nRE to the storage device 224 through a fifth pin P25. The controller interface circuit 230a may receive the data strobe signal DQS from the storage device 224 through a sixth pin P26, or may transmit the data strobe signal DQS to the storage device 224.

In the data DATA output operation of the storage device 224, the controller interface circuit 230a may generate a toggling read enable signal nRE, and may transmit the read enable signal nRE to the storage device 224. For example, the controller interface circuit 230a may generate the read enable signal nRE that changes from the static status (e.g., a high level or a low level) to the toggle status before the data DATA is output. Accordingly, the toggling data strobe signal DQS may be generated in the storage device 224 on the basis of the read enable signal nRE. The controller interface circuit 230a may receive the data signal DQ including the data DATA along with the toggling data strobe signal DQS from the storage device 224. The controller interface circuit 230a may acquire the data DATA from the data signal DQ on the basis of the toggle timing of the data strobe signal DQS.

In the data DATA input operation of the storage device 224, the controller interface circuit 230a may generate the toggling data strobe signal DQS. For example, the controller interface circuit 230a may generate the data strobe signal DQS that changes from the static status (e.g., a high level or a low level) to the toggle status before transmitting the data DATA. The controller interface circuit 230a may transmit the data signal DQ including the data DATA to the storage device 224 on the basis of the toggle timings of the data strobe signal DQS.

The controller interface circuit 230a may receive a ready/busy output signal nR/B from the storage device 224 through an eighth pin P28. The controller interface circuit 230a may discriminate the status information of the storage device 224 on the basis of the ready/busy output signal nR/B.

Figure 7:
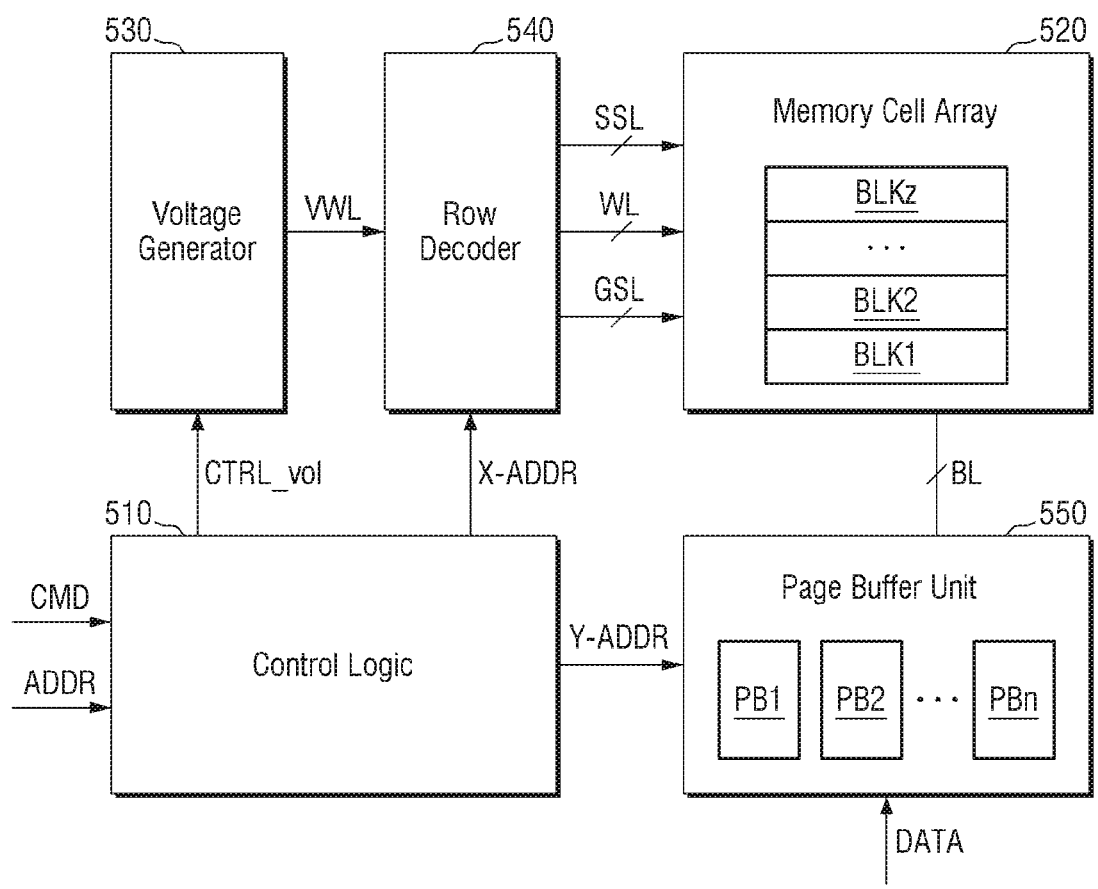
FIG. 7 is an exemplary block diagram showing the storage device of FIG. 6, according to some embodiments.

FIG. 7 is an exemplary block diagram showing the storage device of FIG. 6.

Referring to FIG. 7, the storage device 224 may include a control logic circuit 510, a memory cell array 520, a page buffer unit 550, a voltage generator 530, and a row decoder 540. Although not shown in FIG. 7, the storage device 224 may further include the memory interface circuit 230b shown in FIG. 6, and may further include a column logic, a pre-decoder, a temperature sensor, a command decoder, an address decoder, and the like.

The control logic circuit 510 may generally control various operations inside the storage device 224. The control logic circuit 510 may output various control signals in response to the command CMD and/or the address ADDR from the memory interface circuit 230b. For example, the control logic circuit 510 may output a voltage control signal CTRL vol, a row address X-ADDR, and a column address Y-ADDR.

The memory cell array 520 may include a plurality of memory blocks BLK1 to BLKz (z is a positive integer), and each of the plurality of memory blocks BLK1 to BLKz may include a plurality of memory cells. The memory cell array 520 may be connected to the page buffer unit 550 through the bit lines BL, and may be connected to the row decoder 540 through word lines WL, string selection lines SSL, and ground selection lines GSL.

In an exemplary embodiment, the memory cell array 520 may include a three-dimensional memory cell array, and the three-dimensional memory cell array may include a plurality of NAND strings. Each NAND string may include memory cells connected to word lines stacked vertically on the substrate. U.S. Pat. Nos. 7,679,133, 8,553,466, 8,654,587, 8,559,235, and U.S. Patent Application Publication No. 2011/0233648 are incorporated herein by reference. In an exemplary embodiment, the memory cell array 520 may include a two-dimensional memory cell array, and the two-dimensional memory cell array may include a plurality of NAND strings placed along row and column directions.

The page buffer unit 550 may include a plurality of page buffers PB1 to PBn (n is an integer of three or more), and each of the plurality of page buffers PB1 to PBn may be connected to the memory cells through a plurality of bit lines BL. The page buffer unit 550 may select at least one bit line among the bit lines BL in response to the column address Y-ADDR. The page buffer unit 550 may operate as an entry driver or a detection amplifier, depending on the operating mode. For example, at the time of the program operation, the page buffer unit 550 may apply a bit line voltage corresponding to the data to be programmed to the selected bit line. At the time of the read operation, the page buffer unit 550 may detect the current or voltage of the selected bit line and detect the data stored in the memory cell.

The voltage generator 530 may generate various types of voltages for performing program, read, and erasure operations on the basis of the voltage control signal CTRL vol. For example, the voltage generator 530 may generate a program voltage, a read voltage, a program verification voltage, an erasure voltage, and the like, as a word line voltage VWL.

The row decoder 540 may select one of a plurality of word lines WL, and select one of a plurality of string selection lines SSL in response to the row address X-ADDR. For example, the row decoder 540 may apply a program voltage and a program verification voltage to the selected word line at the time of the program operation, and may apply a read voltage to the selected word line at the time of the read operation.

Figure 8:
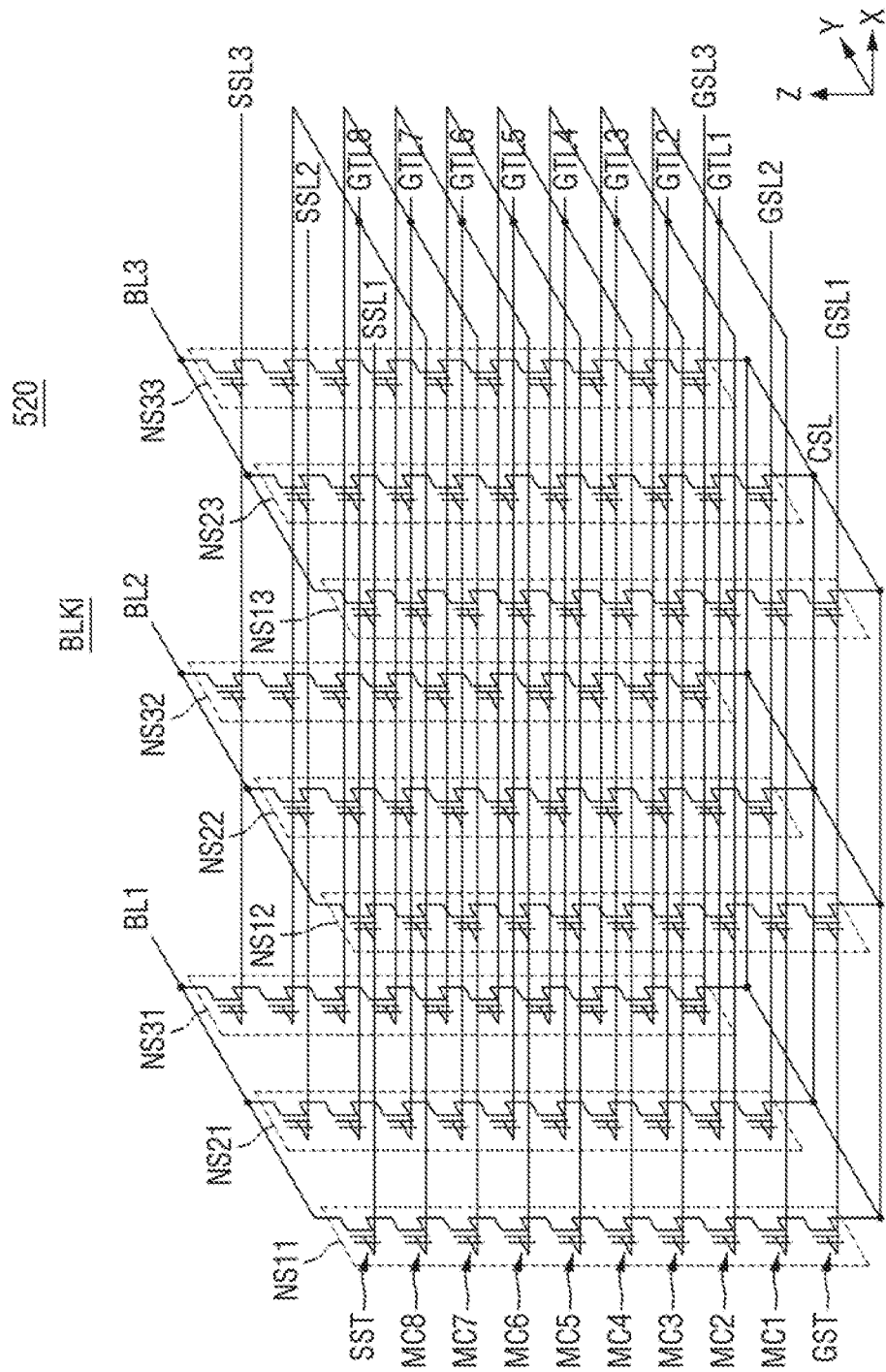
FIG. 8 is a diagram for explaining a 3D V-NAND structure according to some embodiments.

FIG. 8 is a diagram for explaining a 3D V-NAND structure according to some embodiments.

When the storage module of the storage device is implemented as a 3D V-NAND type flash memory, each of the plurality of memory blocks constituting the storage module may be represented by an equivalent circuit as shown in FIG. 8.

A memory block BLKi shown in FIG. 8 shows a three-dimensional memory block formed in a three-dimensional structure on the substrate. For example, a plurality of memory NAND strings included in the memory block BLKi may be formed in a direction perpendicular to the substrate.

Referring to FIG. 8, the memory block BLKi may include a plurality of memory NAND strings NS11 to NS33 connected between the bit lines BL1, BL2, and BL3 and the common source line CSL. A plurality of memory NAND strings NS11 to NS33 may each include a string selection transistor SST, a plurality of memory cells MC1, MC2, ..., MC8, and a ground selection transistor GST. Although FIG. 7 shows that each of the plurality of memory NAND strings NS11 to NS33 includes eight memory cells MC1, MC2, ..., MC8, the embodiment is not necessarily limited thereto.

The string selection transistor SST may be connected to the corresponding string selection lines SSL1, SSL2, and SSL3. The plurality of memory cells MC1, MC2, ..., MC8 may each be connected to the corresponding gate lines GTL1, GTL2, ..., and GTL8. The gate lines GTL1, GTL2, GTL8 may correspond to word lines, and some of the gate lines GTL1, GTL2, ..., GTL8 may correspond to dummy word lines. The ground selection transistor GST may be connected to the corresponding ground selection lines GSL1, GSL2, and GSL3. The string selection transistor SST may be connected to the corresponding bit lines BL1, BL2, and BL3, and the ground selection transistor GST may be connected to the common source line CSL.

The word lines (e.g., WL1) of the same height are connected in common, and the ground selection lines GSL1, GSL2, and GSL3 and the string selection lines SSL1, SSL2, and SSL3 may be separated from each other. Although FIG. 8 shows that the memory block BLK is connected to eight gate lines GTL1, GTL2, ..., and GTL8 and three bit lines BL1, BL2, and BL3, the embodiment is not necessarily limited thereto.

FIG. 9 is a flowchart for explaining the operation of the memory system according to some embodiments. FIGS. 10 to 16 are diagrams for explaining the operation of the memory system according to some embodiments.

First, referring to FIG. 9, the host device 100 transmits a command for requesting the EOM (Eye Open Monitor) operation performance to the memory device 200 (S110).

Figure 10:
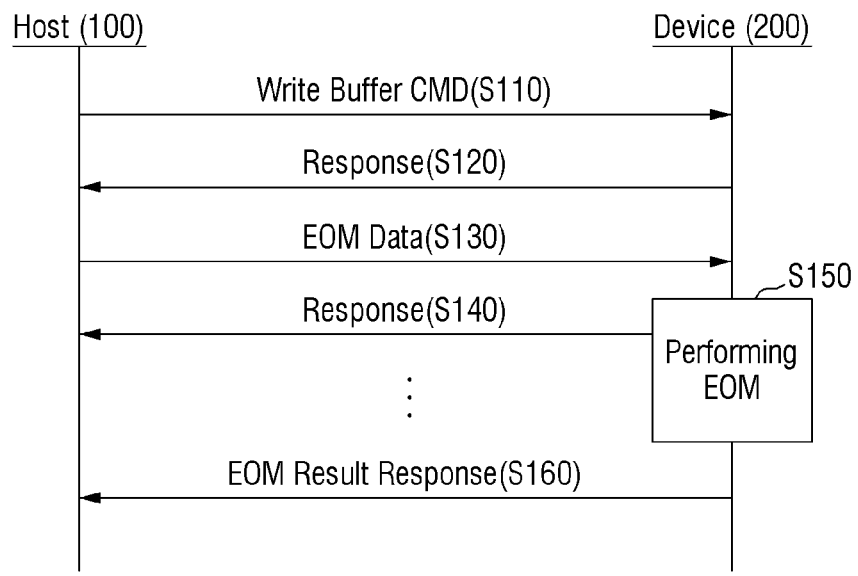

In some embodiments, such a request command may be implemented in the form of WRITE BUFFER COMMAND shown in FIG. 10 which complies with the JEDEC UFS standard. FIG. 10 is a diagram showing a CDB (Command Descriptor Block) of a WRITE BUFFER COMMAND which complies with the JEDEC UFS standard, and FIG. 11 is a diagram showing a description of the mode (MODE) field setting values of the WRITE BUFFER COMMAND.

Specifically, referring to FIGS. 1, 10 and 11, the UFS host controller 110 of the host device 100 sets the mode (MODE) field of the WRITE BUFFER COMMAND to 1F, and may request the UFS device controller 210 of the memory device 200 to perform the EOM operation. Further, the UFS device controller 210 that receives the request may prepare for the EOM operation.

In some embodiments, the operations of the UFS host controller 110 and the operations of the UFS device controller 210 may be performed by controlling the UFS host controller 110 and the UFS device controller 210 using a predetermined firm ware. However, the embodiments are not limited thereto.

Referring to FIG. 11, FIG. 11 shows an example in which the EOM operation is requested when the setting value of the mode (MODE) field of WRITE BUFFER COMMAND is 1F. However, the embodiment is not limited to the shown example. If necessary, the setting value of the mode (MODE) field that requests the EOM operation may be modified into another setting value (for example, other setting values set as 'Reserved' in the standard specifications such as 1D and 1E).

On the other hand, referring to FIGS. 1 and 10, the UFS host controller 110 may send the size of EOM data to be described later to the UFS device controller 210, using a parameter list length field of the WRITE BUFFER COMMAND.

Next, referring to FIG. 9, the memory device 200 transmits response to the WRITE BUFFER COMMAND to the host device 100 (S120).

In some embodiments, such a response may include data capacity information which is receivable by the memory device 200. That is, when the memory device 200 responds to the host device 100, for example, by k (k is a natural number) byte as a response, the host device 100 may transmit data to be transmitted to the memory device 200 later (for example, data necessary for performing the EOM operation) by dividing the data in units of k bytes.

Next, referring to FIG. 9, the host device 100 transmits the generated EOM data to the memory device 200, and the memory device 200 transmits the response to the EOM data reception to the host device 100 (S130, S140).

In this embodiment, the host device 100 may generate the EOM data required for the EOM operation to be performed in the memory device 200.

A generation time point of the EOM data may be before a time point (S110) when the host device 100 transmits a command for requesting the EOM operation performance to the memory device 200, and may be after a time point (S120) when the response to WRITE BUFFER COMMAND is received from the memory device 200 to the host device 100.

Further, in some embodiments, the generation time point of the EOM data may be a time point between the time point (S110) when the host device 100 transmits the command for requesting the EOM operation performance to the memory device 200 and the time point (S120) when the response to WRITE BUFFER COMMAND is received from the memory device 200 to the host device 100. That is, the timing when the host device 100 generates the EOM data required for the EOM operation to be performed in the memory device 200 may be modified as much as possible.

In some embodiments, the EOM data generated by the host device 100 may include parameters required for performing the EOM operation and pattern data required for performing the EOM operation.

In some embodiments, the parameters required for performing the EOM operation may include offset values dX and dY required for performing the EOM operation of the memory device 200 described above.

An offset value dX may include a time offset value, a phase offset value, and the like, and an offset value dY may include a voltage offset value, or the like. However, the embodiments are not limited thereto.

Further, the parameters required for performing the EOM operation may include phase resolution information. Such phase resolution information may be used for receiving the pattern data from the host device 100 by the memory device 200.

In some embodiments, the pattern data necessary for performing the EOM operation is a serial bit (SB of FIG. 3) provided from the host device 100 required to perform the EOM operation of the memory device 200 described above.

In some embodiments, the host device 100 may generate a plurality of pattern data, and such a plurality of pattern data are generated by combination of various bit sequences as much as possible, and the EOM operation performance result may be generated using a consistent data pattern. A symbol in the pattern data may be referred to as a pattern symbol.

Although examples of the pattern data include PRBS (pseudorandom binary sequence) data, CRPAT (Compliant Random Test Pattern) data, CJTPAT (Compliant jitter tolerance pattern) data, and the like, the embodiments are not limited thereto.

FIG. 12 is a diagram showing a structure of EOM data transmitted to the memory device 200 by the host device 100 according to some embodiments.

Referring to FIG. 12, the EOM data may include an EOM data header EDH and an EOM data pattern EDP.

The EOM data header EDH may include parameters required to perform the EOM operation. For example, the phase selection field (PHASE SELELCT) includes the time offset value or phase offset value to be sent to the memory device 200, and the reference voltage control field (VREF CONTROL) may include a voltage offset value to be sent to the memory device 200.

That is, the time offset value or the phase offset value required to perform the EOM operation described above referring to FIGS. 3 and 4 in the memory device 200 may be provided from the host device 100 to the memory device 200 through the phase selection field (PHASE SELELCT). Also, the voltage offset value required to perform the EOM operation described above referring to FIGS. 3 and 4 in the memory device 200 may be provided from the host device 100 to the memory device 200 through the reference voltage control field (VREF CONTROL).

On the other hand, the phase resolution information (gear information) referred to by the memory device 200 for receiving the pattern data from the host device 100 may be provided from the host device 100 to the memory device 200 through the phase resolution field (PHASE RESOLUTION).

Further, the number of samplings performed by the memory device 200 while performing the EOM operation may be provided from the host device 100 to the memory device 200 through the sampling number field (NUMBER OF SAMPLING).

Further, the size of the pattern data to be received from the host device 100 by the memory device 200 may be provided from the host device 100 to the memory device 200 through the data length field (EOM DATA LENGTH).

Although FIG. 12 shows an example of an EOM data header EDH made up of 12 bytes, the embodiments are not limited thereto, and the size of the EOM data header EDH may be modified as much as possible.

The EOM data pattern EDP may include pattern data necessary for performing the EOM operation. As shown in FIG. 12, the EOM data pattern EDP may include a plurality of pattern data. In some embodiments, N shown in FIG. 12 may be a natural number greater than 12.

Figure 13:
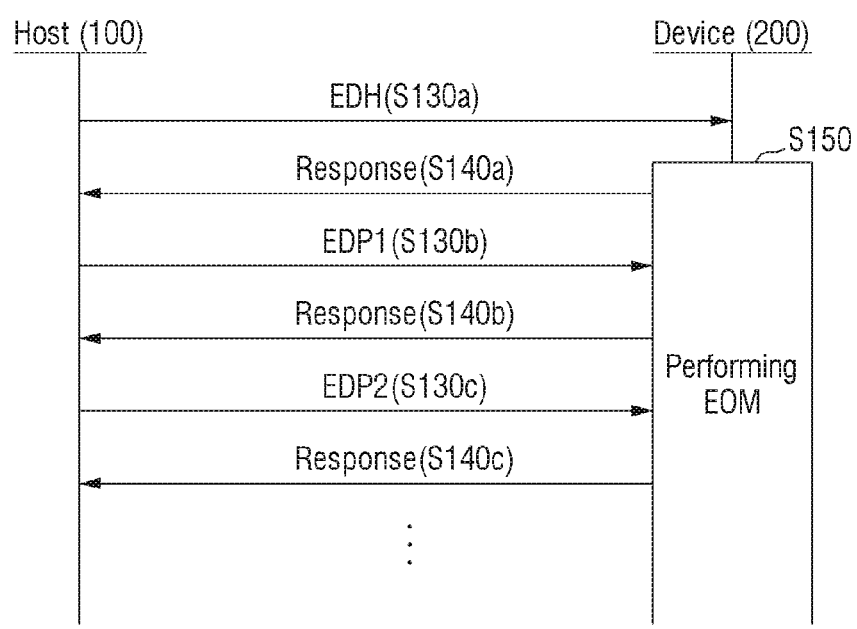

Referring to FIG. 13, the EOM data header EDH and the EOM data pattern EDP may be transmitted from the host device 100 to the memory device 200 several times. At this time, receivable data capacity information by which the memory device 200 responses to the host device 100 in step S110 of FIG. 9 above may be considered in determining a method of transmitting the EOM data header EDH and the EOM data pattern EDP to the memory device 200 from the host device 100.

For example, in step S110 of FIG. 9, if the receivable data capacity information by which the memory device 200 responds to the host device 100 is 12 bytes, the host device 100 may transmit the EOM data header EDH and the EOM data pattern EDP to the memory device 200 by the method as shown in FIG. 13.

Specifically, the host device 100 first transmits the EOM data header EDH having a 12-byte size to the memory device 200 (S130a). Further, the memory device 200 responds to the host device 100 that the EOM data header EDH is received (S140a).

Subsequently, the host device 100 transmits the 12-byte size EOM data pattern EDP among the EOM data pattern EDP to the memory device 200 (S130b). Further, the memory device 200 responds to the host device 100 that the EOM data pattern EDP is received (S140b). Further, the host device 100 transmits the subsequent 12-byte size EOM data pattern EDP among the EOM data pattern EDP to the memory device 200 (S130c). Further, the memory device 200 responds to the host device 100 that the EOM data pattern EDP is received (S140c). By repeating such a manner, all the EOM data patterns EDP shown in FIG. 12 may be provided from the host device 100 to the memory device 200.

On the other hand, the structure of the EOM data to be transmitted to the memory device 200 by the host device 100 is not limited to the example shown in FIG. 12.

FIG. 14 is a diagram showing a structure of EOM data to be transmitted to the memory device 200 by the host device 100 according to some other embodiments.

Referring to FIG. 14, the EOM data may include an EOM data header EDH and an EOM data pattern EDP.

The EOM data header EDH may include the parameters required to perform the EOM operation.

For example, a timing offset field and a timing step field may include a time offset value or a phase offset value to be sent to the memory device 200, and a voltage offset field and a voltage step field may include the voltage offset value to be sent to the memory device 200.

That is, the time offset value or phase offset value required to perform the EOM operation described above referring to FIGS. 3 and 4 in the memory device 200 may be provided from the host device 100 to the memory device 200 through the timing offset field and the timing step field. Further, the voltage offset values required to perform the EOM operation described above referring to FIGS. 3 and 4 in the memory device 200 may be provided from the host device 100 to the memory device 200 through the voltage offset field and the voltage step field.

That is, in this embodiment, the offset value dX and the offset value dY shown in FIGS. 3 and 4 are not indicated by one value as in the embodiment shown in FIG. 12, but are expressed by two fields of the reference value (reference phase or reference voltage) and the offset value of the reference value (offset phase value or offset voltage value).

On the other hand, the number of samplings performed by the memory device 200 while performing the EOM operation may be provided from the host device 100 to the memory device 200 through the sampling number field (Number of Sampling).

Further, the size of the pattern data to be received to the memory device 200 from the host device 100 may be provided from the host device 100 to the memory device 200 through the data length field (Total Data Length).

Referring to FIG. 9 again, the memory device 200 provided with the EOM data performs the EOM operation (S150).

In some embodiments, the EOM operation may be performed during reception of the EOM data pattern (EDP of FIG. 13) after the EOM data header (EDH of FIG. 13) is received. However, the embodiments are not limited thereto, and the EOM operation may also be performed after all the EOM data patterns (EDP of FIG. 13) have been received.

Referring to FIGS. 1 to 5 and 15, the comparator 255b may perform an error counting operation of outputting an error counting signal EC to each symbol in the pattern data provided from the host device 100, and a sampling count operation of outputting a sampling count signal SC.

Figure 15:
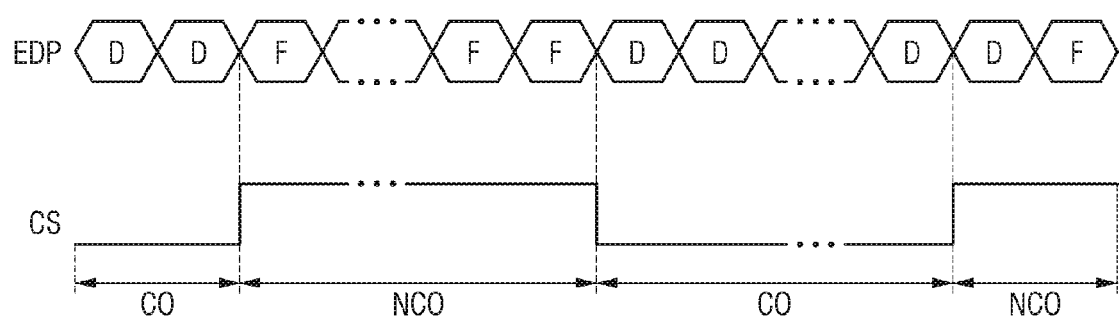

Referring to FIGS. 3 and 15, if the symbol in the pattern data EDP is a data symbol D, the non-data symbol detector 254 does not output the control signal CS. As a result, the comparator 255b performs the error counting operation of outputting the error count signal EC and the sampling count signal SC (a CO section).

After that, if the symbol in the pattern data EDP is the filler symbol F, the non-data symbol detector 254 outputs the control signal CS. As a result, the comparator 255b does not perform the error counting operation of outputting the error count signal EC and the sampling count signal SC (a NCO section). As a result, the EOM operation is not performed on the filler symbol F in the pattern data EDP.

The sampling count signal SC may be used to determine whether the sampling number of the sampling number field (NUMBER OF SAMPLING) provided to the memory device 200 from the host device 100 is the same as the sampling number performed by the memory device 200.

The error count signal EC may be used to calculate the error count value corresponding to the phase offset value provided through the phase selection field (PHASE SELELCT) and the voltage offset value provided through the reference voltage control field (VREF CONTROL), for all pattern data received from the host device 100.

For example, if one hundred data symbols and one hundred filler symbols are transmitted to the pattern data EDP from the host device 100 for performing the EOM operation of the memory device 200, the comparator 255b performs the error counting operation on the one hundred data symbols, but does not perform the error counting operation on the one hundred filler symbols.

Referring to FIG. 9 again, after performing the EOM operation, the memory device 200 transmits a response signal including the performance result of the EOM operation to the host device 100 (S160).

At this time, the response signal may include the success or failure of the EOM operation performance, and the error count value corresponding to the phase offset value and the voltage offset value. In this embodiment, such an error count value is an error count value of a data symbol in the pattern data EDP.

For example, if the sampling number of the sampling number field (NUMBER OF SAMPLING) provided from the host device 100 to the memory device 200 is the same as the number of sampling count signal SC output from the comparator 255b of the memory device 200, the memory device 200 may determine that the EOM operation performance is completed, and may transmit completion information to the host device 100.

In contrast, if the sampling number of the sampling number field (NUMBER OF SAMPLING) provide from the host device 100 to the memory device 200 is different from the number of the sampling count signal SC output from the comparator 255b of the memory device 200, the memory device 200 may determine that the EOM operation performance is not completed, and may transmit failure information to the host device 100.

In some embodiments, although the success or failure of the EOM operation performance may be provided to the host device 100, for example, through the response field (Response) shown in FIG. 16, the embodiment is not limited thereto.

Also, in some embodiments, although the error count values described above may be provided to, for example, the host device 100 through the four sense data fields (Sense Data[0], Sense Data[1], Sense Data[2], and Sense Data[3]) shown in FIG. 16, the embodiment is not limited thereto.

The EOM operation performance result thus generated may be referred to and used for changing the signal driving characteristics of the host device 100 or changing the signal receiving characteristics of the memory device 200.

In the memory system described above, another external device is not required to grasp the quality characteristics of the signals transmitted and received between the host device 100 and the memory device 200. Further, the signal line on which the EOM operation is performed is also the same as the signal line on which the host device 100 and the memory device 200 actually transmit and receive signals. This makes it possible to perform the EOM operation which is easy and has high reliability. Also, since the EOM operation is not performed on the filler symbol, it is possible to improve the reliability of EOM measurement.

Figure 17:
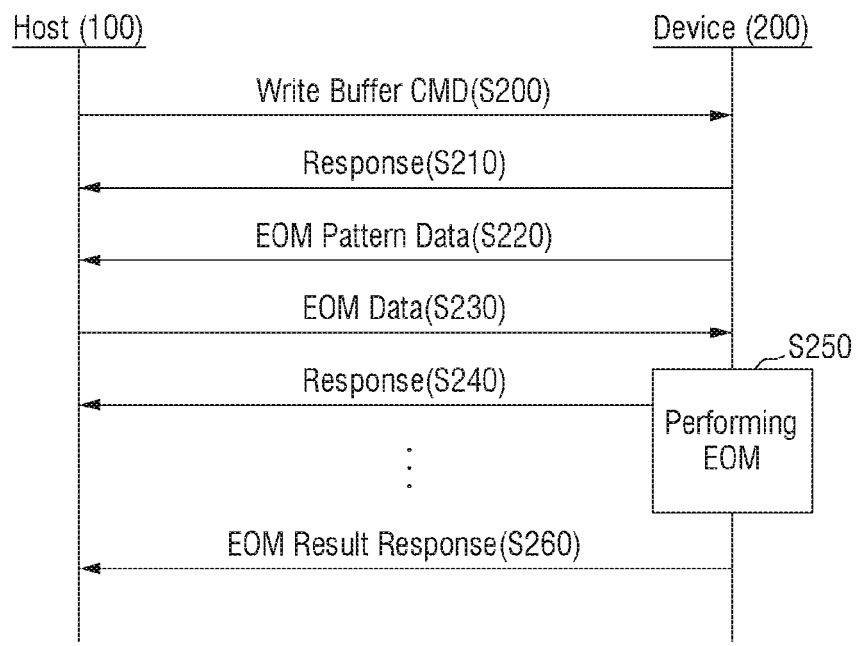
FIG. 17 is a flowchart for explaining the operation of the memory system according to some other embodiments.

FIG. 17 is a flowchart for explaining the operation of the memory system according to some other embodiments.

Hereinafter, repeated explanation of the above-described embodiment will be omitted as much as possible, and differences will be mainly described.

Referring to FIG. 17, the host device 100 transmits a command for requesting the EOM operation performance to the memory device 200 (S200). Further, the memory device 200 transmits a response to the WRITE BUFFER COMMAND to the host device 100 (S210).

Subsequently, the memory device 200 transmits the pattern data necessary for performing the EOM operation to the host device 100 (S220).

Referring to FIG. 1, in some embodiments, although the pattern data necessary for performing the EOM operation is stored in the non-volatile memory 220 of the memory device 200, and then may be transmitted to the host device 100, the embodiments are not limited thereto.

That is, in this embodiment, unlike the embodiment described above referring to FIG. 9, the host device 100 does not generate the pattern data necessary for performing the EOM operation, but uses the pattern data stored in the memory device 200 for performing the EOM operation.

After that, the host device 100 transmits the EOM data including the parameters necessary for performing the EOM operation and the pattern data received from the memory device 200 to the memory device 200 (S230). Further, the memory device 200 transmits a response to the reception of the EOM data to the host device 100 (S240). The memory device 200 provided with the EOM data performs the EOM operation (S250), and the memory device 200 that performs the EOM operation transmits a response signal including the EOM operation performance result to the host device 100 (S260).

Figure 18:
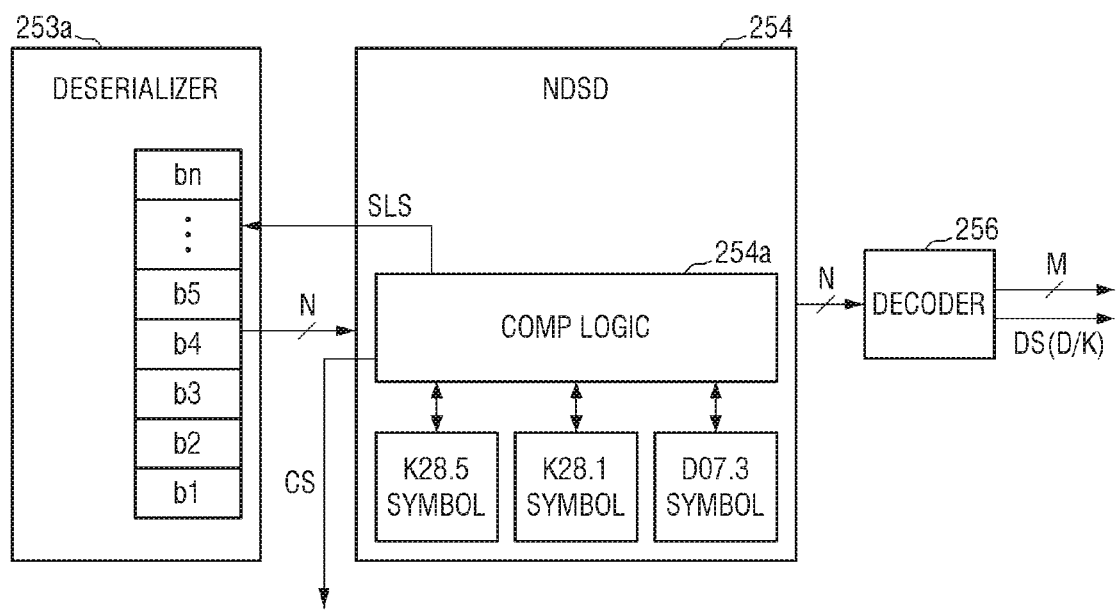
FIG. 18 is a diagram showing a non-data symbol detector according to some other embodiments.

FIG. 18 is a diagram showing a non-data symbol detector according to some other embodiments. Hereinafter, differences from the above-described embodiment will be mainly described.

Referring to FIG. 18, the non-data symbol detector 254 may include a comparison logic 254a which receives the N-bit signal that is output from the deserializer 253a, and determines whether the N-bit signal is a predetermined symbol. In some embodiments, although the N-bit signal is a 10-bit signal, the embodiments are not limited thereto.

In this embodiment, the comparison logic 254a may further determine whether the N-bit signal is a D07.3 symbol which means filler data. When the received signal is a scrambled signal, the comparison logic 254a may determine whether the N-bit signal is a D07.3 symbol and determine the filler symbol.

Specifically, the comparison logic 254a determines whether the input signal is the D07.3 symbol which is 1110001100 or 0001110011 when the N-bit signal is a 10-bit signal, and if the input signal corresponds to the D07.3 symbol, the comparison logic 254a may provide the control signal CS for stopping the performance of the error count operation to the comparator (255b of FIG. 3). Accordingly, the comparator (255b of FIG. 3) may not perform the EOM operation on the filler symbol.

Figure 19:
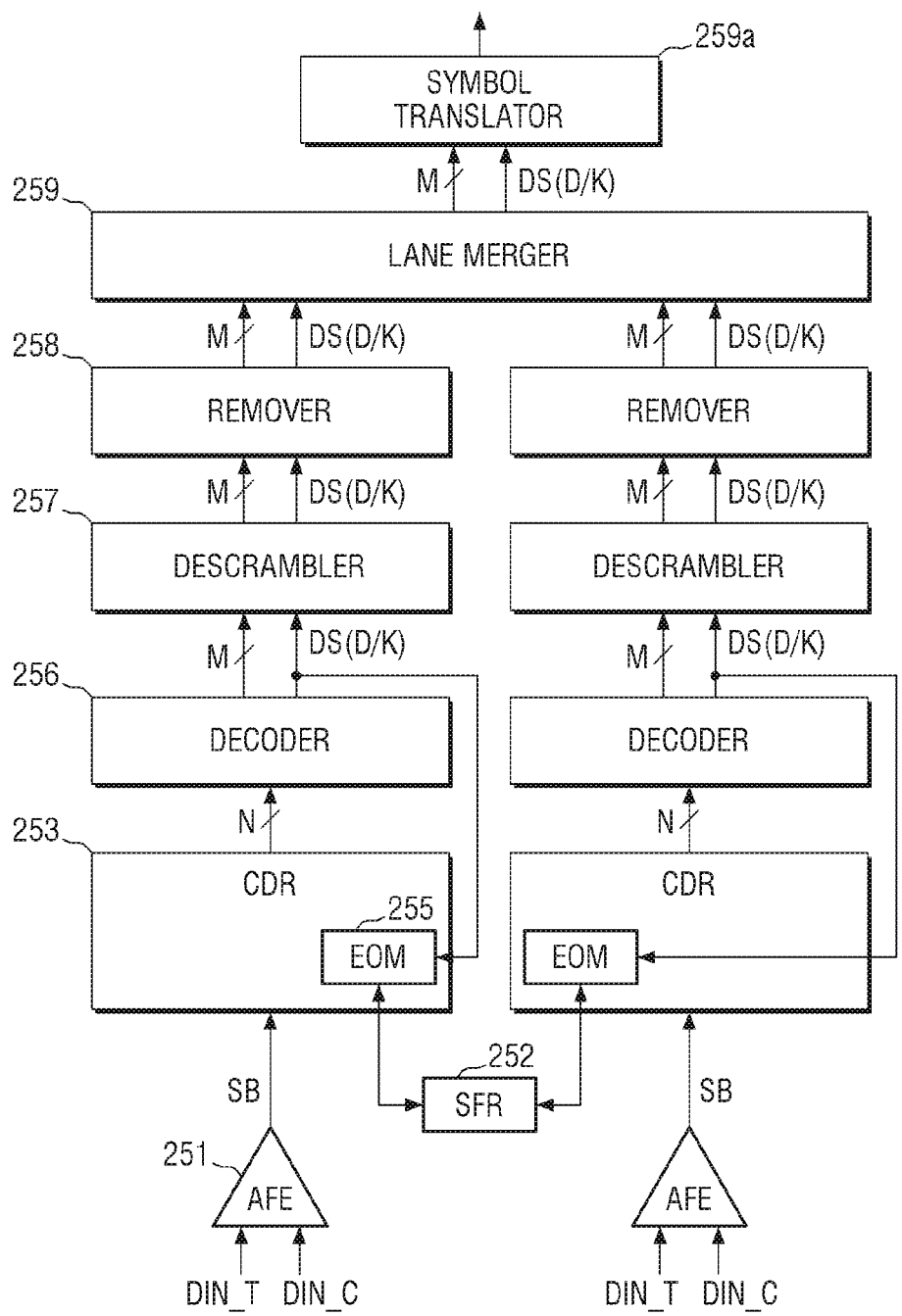
FIG. 19 is a diagram showing a UIC layer according to some other embodiments.
Figure 20:
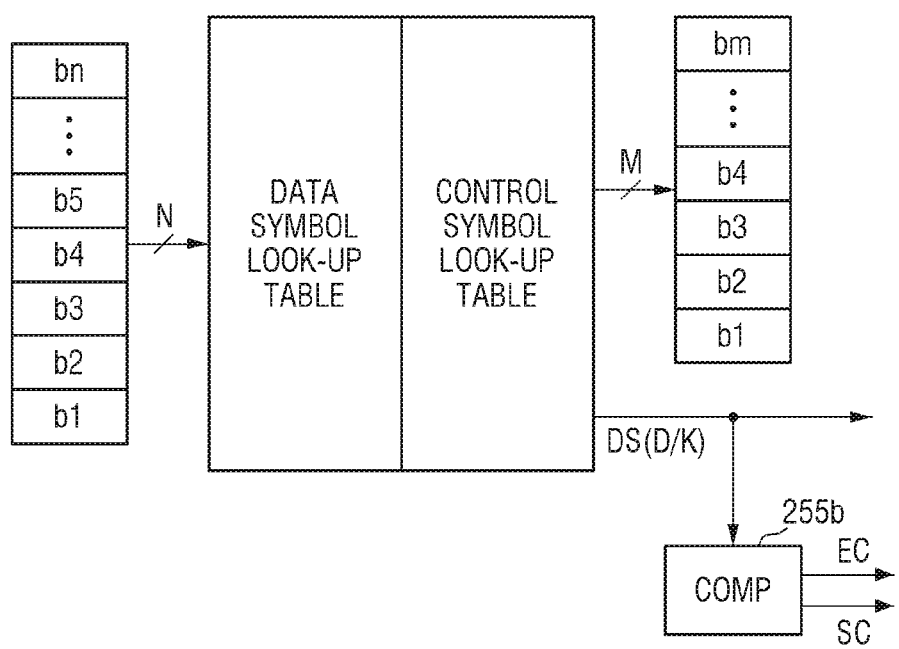
FIG. 20 is a diagram for explaining the operation of the UIC layer according to some other embodiments.

FIG. 19 is a diagram showing a UIC layer according to some other embodiments. FIG. 20 is a diagram for explaining the operation of the UIC layer according to some other embodiments. Hereinafter, differences from the above-described embodiment will be mainly described.

Referring to FIGS. 19 and 20, in this embodiment, the non-data symbol detector (254 of FIG. 2) is not placed in the CDR block (253 of FIG. 2) of a front stage of the decoder 256, but the distinction signal DS output from the decoder 256 is used as the control signal of the comparator 255b.

The decoder 256 may compare the input N-bit signal with the data symbol lookup table and the control symbol lookup table. Further, when the N-bit signal is a data symbol, the decoder 256 may output the M-bit signal and the data signal D as the distinction signal DS. Further, when the N-bit signal is the control symbol, the decoder 256 may output the M-bit signal and the control signal K as the distinction signal DS. In some embodiments, although the N-bit signal may be a 10-bit signal and the M-bit signal may be an 8-bit signal, the embodiments are not limited thereto.

When the distinction signal DS output from the decoder 256 is the data signal D, the comparator 255b according to the present embodiment performs the error counting operation and performs EOM, and when the distinction signal DS to be output is the control signal K, the error counting operation is not performed and the EOM is not performed. Accordingly, the EOM is not performed on all control symbols including the filler symbol described above.

Figure 21:
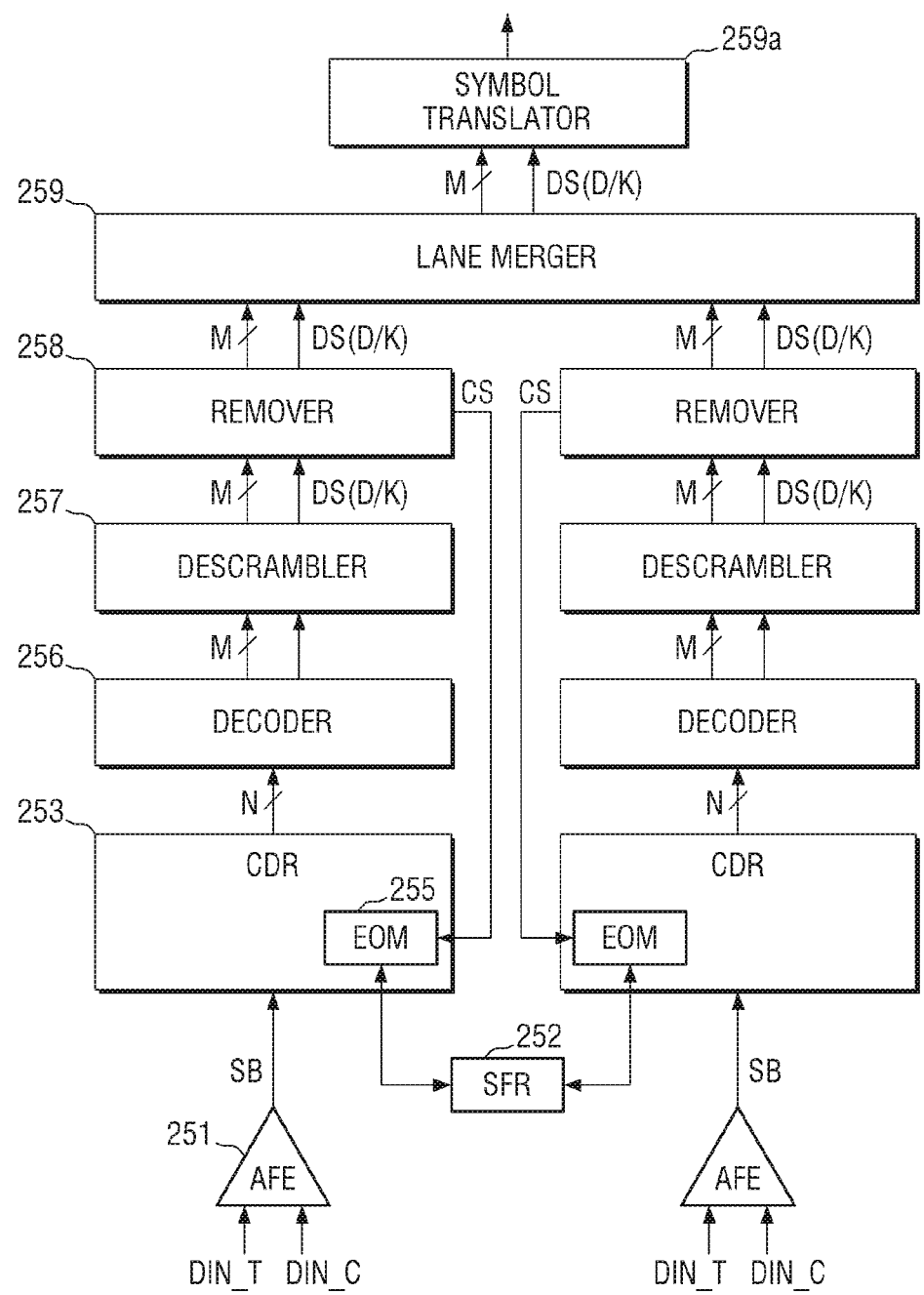
FIG. 21 is a diagram showing a UIC layer according to some other embodiments.

FIG. 21 is a diagram showing a UIC layer according to some other embodiments. Hereinafter, differences from the above-described embodiment will be mainly described.

Referring to FIG. 21, in the present embodiment, when the received signal is a scrambled signal, the descrambling is performed through the descrambler 257, and the signal is provided to the symbol remover 258. Here, when the symbol remover 258 performs the operation of removing the skip symbol which is a non-data symbol, the symbol remover 258 generates the control signal CS and provide it to the comparator (e.g., 255b of FIG. 3), thereby stopping, or inhibiting, the error counting operation. According to such a configuration, there may be a slight delay between the time point when the non-data symbol is received to the CDR block 253 and the time point when the error counting operation of the comparator (e.g., 255b of FIG. 3) is stopped.

Figures 22, 23:
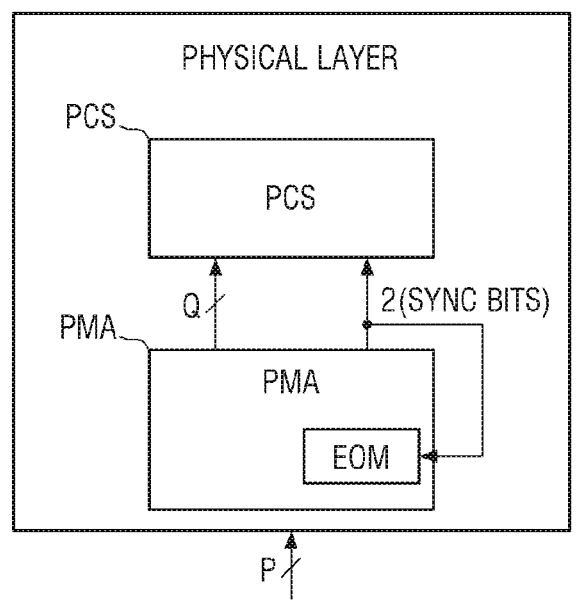
FIGS. 22 and 23 are diagrams for explaining a method for performing an EOM operation according to some embodiments.

FIGS. 22 and 23 are diagrams for explaining a method for performing the EOM operation according to some embodiments.

Referring to FIG. 22, a physical layer of the signal receiver (e.g., UIC layer 250 of FIG. 1) may include a PMA (Physical Medium Attachment) block (PMA) and a PCS (Physical Coding Sublayer) block.

The PMA block (PMA) may receive P-bit (P is a natural number) data, decode the P-bit data, and output Q-bit (Q is a natural number smaller than P) data and a sync bit including 2 bits. In some embodiments, although the P-bit data may include 66-bit data and the Q-bit data may include 64-bit data, the embodiments are not limited thereto.

The sync bit including 2 bits may be defined as shown in FIG. 23. That is, when the sync bit is 00 or 11, this case indicates that there is an error in the P-bit data. When the sync bit is 01, this case indicates that the P-bit data is a data bit. When the sync bit is 10, this case may indicate that the P-bit data is a control bit.

The PMA block (PMA) may stop the EOM operation performance, including the error counting operation, when 2-bit sync bits are 10.

Figure 24:
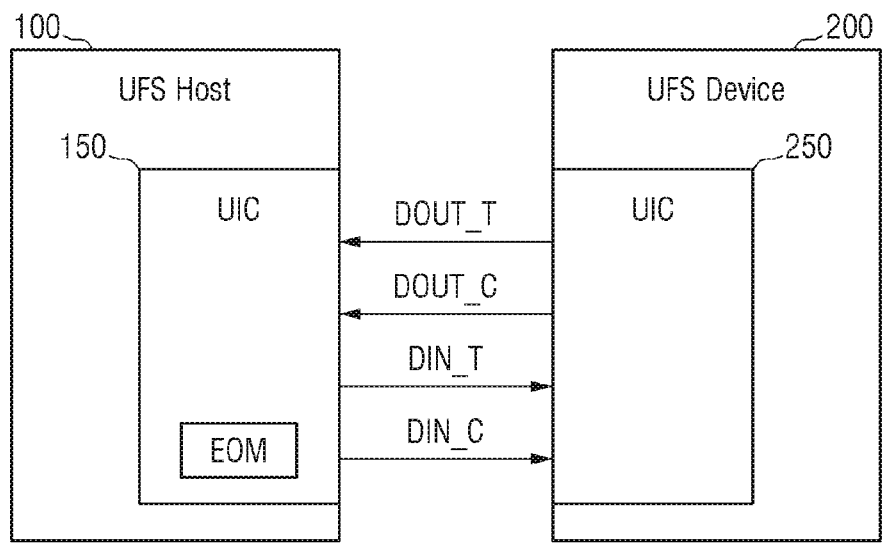
FIG. 24 is a diagram showing a memory system according to some other embodiments.

FIG. 24 is a diagram showing a memory system according to some other embodiments. Hereinafter, differences from the above-described embodiment will be mainly described.

Referring to FIG. 24, in this embodiment, the UIC layer 150 of the host device 100 performs the above-mentioned EOM operation. For example, the UIC layer 150 of the host device 100 may perform the EOM operation on the differential output signal pairs DOUT_T and DOUT_C received from the memory device 200.

Figure 25:
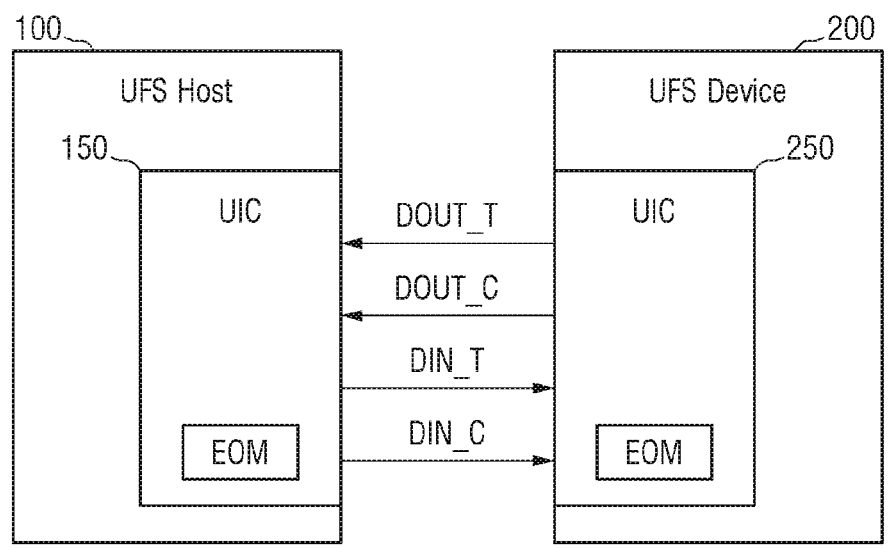
FIG. 25 is a diagram showing a memory system according to some other embodiments.

FIG. 25 is a diagram showing a memory system according to some other embodiments. Hereinafter, differences from the above-described embodiment will be mainly described.

Referring to FIG. 25, in this embodiment, both the UIC layer 150 of the host device 100 and the UIC layer 250 of the memory device 200 perform the aforementioned EOM operation.

Figure 26:
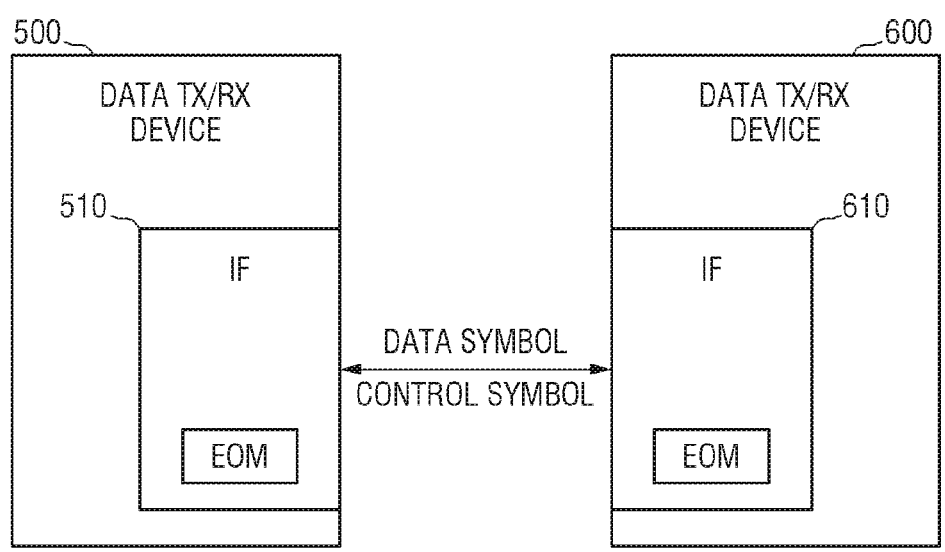
FIG. 26 is a diagram showing a data transmission and reception system according to some embodiments.

FIG. 26 is a diagram showing a data transmitting/receiving device system according to some embodiments.

Referring to FIG. 26, a first data transmitting/receiving device 500 includes a first interface 510. The second data transmitting/receiving device 600 includes a second interface 610.

The first interface 510 and the second interface 610 may perform the aforementioned EOM operation. That is, the data symbol sent between the first data transmitting/receiving device 500 and the second data transmitting/receiving device 600 may be subjected to the EOM operation including the error counting, and the control symbol including the filler symbol may not be subjected to the EOM operation including the error counting.

In some embodiments, the first data transmitting/receiving device 500 may be a camera module, and the second data transmitting/receiving device 600 may be an application processor. Further, in some embodiments, the first data transmitting/receiving device 500 may be a display driver IC, and the second data transmitting/receiving device 600 may be a display panel. In addition, the first data transmitting/receiving device 500 and the second data transmitting/receiving device 600 may be implemented by being modified into various electronic devices which are not shown.

Figure 27:
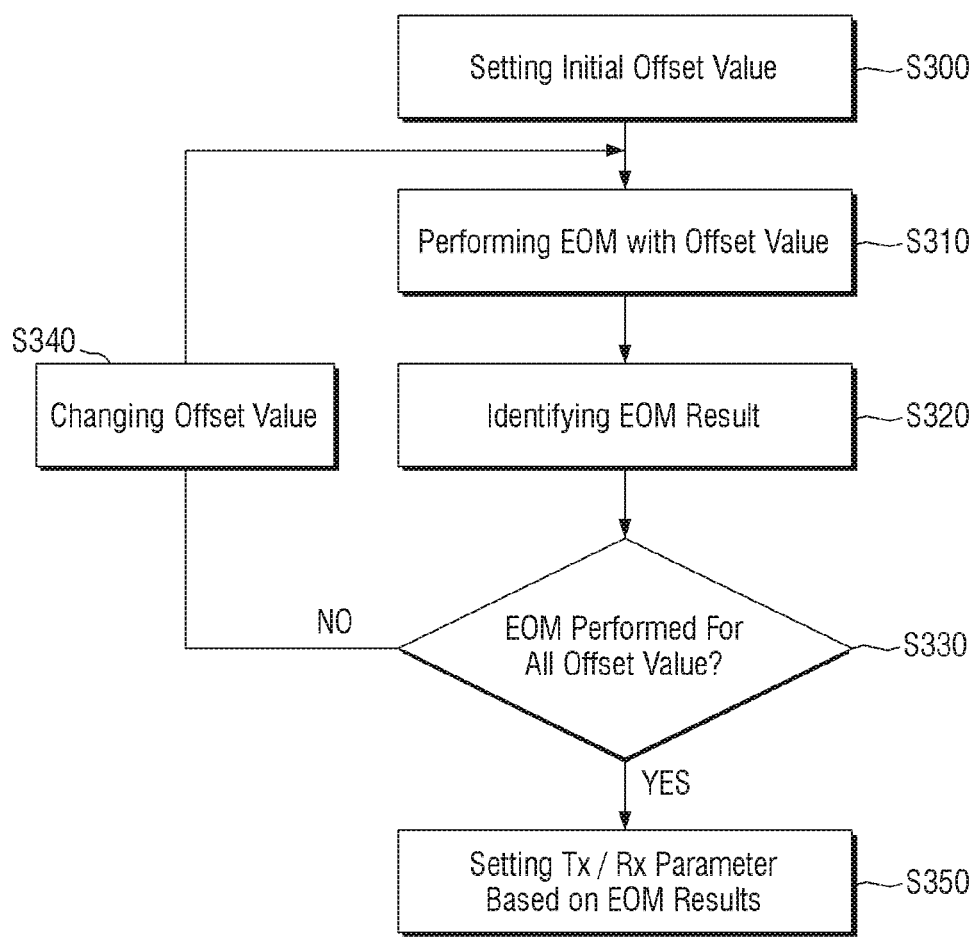
FIG. 27 is a flowchart for explaining the EOM performance operation according to some embodiments.

FIG. 27 is a flowchart for explaining the EOM performance operation.

Referring to FIG. 27, an initial offset value is set (S300).

For example, referring to FIGS. 1 and 12, the host device 100 may set offset values to be included in the EOM data header EDH (e.g., a value to be included in the phase selection field (PHASE SELELCT) and/or a value to be included in a reference voltage control field (VREF CONTROL)).

Next, the EOM operation is performed at the set offset value (S310). Further, the EOM result is checked and the preset value is stored (S320).

For example, the host device 100 and the memory device 200 may perform the EOM operation described above and check the result.

If the EOM operation for all offset values is not performed (S330—N), the offset value is changed (S340), the EOM operation is performed, the result is checked, and the new preset value is stored (S310, S320). That is, the EOM operation may be performed on offset values of the number enough to grasp the quality characteristics of the signal transmitted and received between the host device 100 and the memory device 200, and the preset values may be stored.

If the EOM operation for all offset values is performed (S330—Y), parameters of the transmission terminal and reception terminal of the host device 100 and the memory device 200 are set on the basis of the EOM results (S350).

For example, the host device 100 may set parameters related to signal driving or reception on the basis of the EOM results, and the memory device 200 may also set parameters related to signal driving or reception. However, the embodiments are not limited thereto, and the setting method of the transmission and reception parameters may be modified as much as possible.

Figure 28:
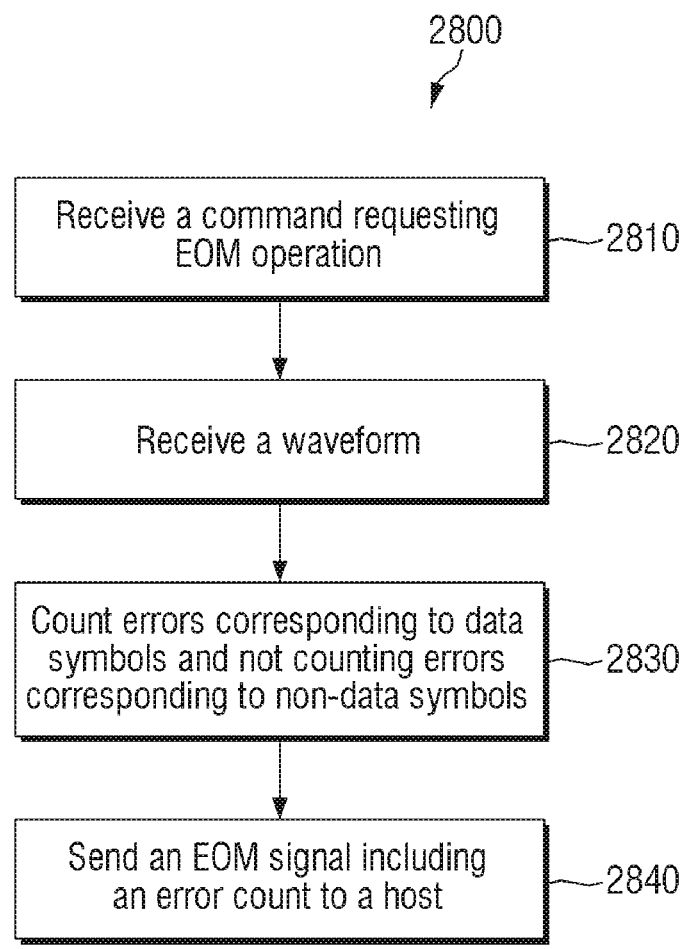
FIG. 28 illustrates a logic flow of improving EOM performance.

FIG. 28 illustrates logic 2800 for improving EOM performance according to the embodiments described above. At operation 2810 of FIG. 28, a command requesting an EOM operation is received. At operation 2820, a waveform is received. At operation 2830, errors associated with data symbols are counted. A counting of errors associated with non-data symbols is inhibited at operation 2830. At operation 2840, an EOM signal is sent to a host with the improved error count.

In concluding the detailed description, those skilled in the art will appreciate that many variations and modifications may be made to the embodiments disclosed herein. Therefore, the disclosed preferred embodiments are used in a generic and descriptive sense only and not for purposes of limitation.

What is claimed is:

1. A method of operating a memory device, the method comprising:
   receiving, from a host device, a command requesting an Eye Open Monitor (EOM) operation;
   receiving pattern data including one or more data symbols and one or more non-data symbols from the host device, wherein the one or more data symbols includes an information symbol and/or a pattern symbol;
   counting, in an error count and as part of the EOM operation, first errors corresponding to the one or more data symbols;
   not counting, in the error count, second errors corresponding to the one or more non-data symbols; and
   transmitting, to the host device, an EOM response signal including the error count.

2. The method of claim 1, wherein the one or more non-data symbols include
   a first non-data symbol, and the first non-data symbol is a filler symbol.

3. The method of claim 2, further comprising:
   determining whether the first non-data symbol is a K28.1 symbol; and
   not counting the second errors in response to the first non-data symbol being the K28.1 symbol.

4. The method of operating the memory device of claim 2, further comprising:
   determining whether the first non-data symbol is a D07.3 symbol; and
   not counting the second errors in response to the first non-data symbol being the D07.3 symbol.

5. The method of operating the memory device of claim 2, wherein each of the one or more data symbols and each of the one or more non-data symbols correspond to an N-bit signal, wherein N is a positive integer,
   the method further comprising:
      decoding the received pattern data into an M-bit signal and a distinction signal, wherein the received pattern data includes a first information symbol and a first control symbol, and M is a positive integer and M is less than N;
      descrambling the M-bit signal; and
      not counting the second errors in response to the descrambled M-bit signal being the filler symbol.

6. The method of operating the memory device of claim 1, wherein the one or more non-data symbols includes a second non-data symbol, and the second non-data symbol is a control symbol.

7. The method of operating the memory device of claim 6, wherein each of the one or more data symbols and each of the one or more non-data symbols corresponds to an N-bit signal, and N is a positive integer,
   the method further comprising:
      decoding the received pattern data into an M-bit signal and a distinction signal, wherein the received pattern data includes a first information symbol and a first control symbol, M is a positive integer and M is less than N; and
      not counting, based on the distinction signal, the second errors.

8. A method of operating a host device, the method comprising:
   transmitting, to a memory device, a command requesting an Eye Open Monitor (EOM) operation;
   transmitting pattern data including one or more data symbols and one or more non-data symbols to the memory device; and
   receiving, from the memory device, an EOM response signal including an error count associated with the pattern data,
   wherein the error count is based on the one or more data symbols and is not based on the non-data symbols.

9. The method of operating the host device of claim 8, wherein the one or more non-data symbols includes a first non-data symbol, and the first non-data symbol is a filler symbol.

10. The method of operating the host device of claim 8, wherein the one or more non-data symbols includes a second non-data symbol, and the second non-data symbol is a control symbol.

11. A memory device comprising:
an interfacing device; and
a device controller configured to control an operation of the interfacing device,
wherein the interfacing device is configured to:
  receive a command requesting an Eye Open Monitor (EOM) operation,
  receive, from a host device, pattern data including one or more data symbols and one or more non-data symbols, wherein the one or more data symbols includes an information symbol and/or a pattern symbol,
  perform an EOM operation including:
    counting, in an error count and as part of the EOM operation, first errors corresponding to the one or more data symbols, and
    not counting, in the error count, second errors corresponding to the one or more non-data symbols, and
  transmit, to the host device, an EOM response signal including the error count.

12. The memory device of claim 11, wherein the pattern data is a serial signal and the interfacing device comprises:
an equalizer configured to receive the serial signal and output a serial bit;
a first deserializer configured to, using the serial bit, generate an N-bit main path signal, wherein N is a positive integer;
a second deserializer configured to, using the serial bit, generate an N-bit EOM path signal;
a comparator configured to perform the counting the first errors based on a difference between a main path signal and the N-bit EOM path signal; and
a non-data symbol detector configured to stop a counting performance of the comparator in response to the main path signal including the one or more non-data symbols.

13. The memory device of claim 12, wherein the non-data symbol detector is configured to stop the counting performance of the comparator, when the N-bit main path signal is either 0011111000 or 1100000110.

14. The memory device of claim 12, wherein the non-data symbol detector is configured to stop the counting performance of the comparator, when the N-bit main path signal is either 1110001100 or 0001110011.

15. The memory device of claim 11, wherein the pattern data is a serial signal and the interfacing device comprises:
an equalizer configured to receive the serial signal and output a serial bit;
a first deserializer configured to, using the serial bit, generate an N-bit main path signal, wherein N is a positive integer;
a second deserializer configured to, using the serial bit, generate an N-bit EOM path signal;
a comparator configured to perform the counting the first errors based on a difference between a main path signal and the N-bit EOM path signal; and
a decoder configured to decode the N-bit main path signal into an M-bit signal and a distinction signal, wherein M is a positive integer, and
wherein the comparator is further configured to receive the distinction signal and stop, in response to the distinction signal, a counting by the comparator.

16. The memory device of claim 15, wherein a value of N is 10 and a value of M is 8.

17. The memory device of claim 11, wherein the pattern data is a serial signal and the interfacing device comprises:
an equalizer configured to receive the serial signal and output a serial bit;
a first deserializer configured to, using the serial bit, generate an N-bit main path signal, wherein N is a positive integer;
a second deserializer configured to, using the serial bit, generate an N-bit EOM path signal;
a comparator configured to perform the counting the first errors based on a difference between a main path signal and the N-bit EOM path signal;
a decoder configured to decode the N-bit main path signal into an M-bit signal and a distinction signal, wherein M is a positive integer and M is less than N;
a descrambler configured to descramble the M-bit signal; and
a symbol remover configured to remove a filler symbol from the descrambled M-bit signal, and
wherein the comparator is further configured to receive the distinction signal and stop, in response to the distinction signal, a counting by the comparator.

18. The memory device of claim 11, wherein the pattern data includes a P-bit signal and P is a positive integer, and
wherein the interfacing device is further configured to:
  receive the P-bit signal,
  decode the P-bit signal into a Q-bit signal and an R-bit sync bit, wherein Q is less than P and R is less than Q, P is a positive integer and R is a positive integer, and
  stop counting the second errors in response to the sync bit having a value in binary digits of 10.

19. The memory device of claim 18, wherein a value of P is 66, a value of Q is 64, and a value of R is 2.

20. The memory device of claim 11, wherein the interfacing device includes a mobile industry processor interface (MIPI) M-PHY configured to receive differential input signal pairs from the host device, and
the memory device includes a Universal Flash Storage (UFS).

* * * * *